United States Patent [19]

Ino et al.

[11] Patent Number: 4,994,877
[45] Date of Patent: Feb. 19, 1991

[54] PHOTOELECTRIC CONVERSION SEMICONDUCTOR DEVICE WITH NOISE LIMITING CIRCUIT

[75] Inventors: Masamitsu Ino; Takehito Nagata, both of Yokohama; Mitsuhiro Kohata, Shibatamachi, all of Japan

[73] Assignees: Ricoh Company, Ltd., Tokyo; Ricoh Research Institute of General Electronics, Miyagi, both of Japan

[21] Appl. No.: 154,199

[22] Filed: Feb. 10, 1988

[30] Foreign Application Priority Data

| Feb. 12, 1987 | [JP] | Japan | 62-30080 |
| Feb. 12, 1987 | [JP] | Japan | 62-30081 |
| Feb. 23, 1987 | [JP] | Japan | 62-39843 |
| Feb. 23, 1987 | [JP] | Japan | 62-39844 |
| Feb. 23, 1987 | [JP] | Japan | 62-39845 |
| Mar. 11, 1987 | [JP] | Japan | 62-57619 |

[51] Int. Cl.[5] .................. H01L 27/140; H01L 31/000; H01L 45/000; H04N 3/140
[52] U.S. Cl. .................. 357/30; 357/42; 357/2; 358/213.150
[58] Field of Search .................. 357/2, 23.14, 30 H, 357/30 K, 42; 437/20; 365/112, 213.29, 233, 221; 358/213, 212, 294, 213.15

[56] References Cited

U.S. PATENT DOCUMENTS

| 4,472,821 | 9/1984 | Mazin et al. | 357/23.14 X |
| 4,567,374 | 1/1986 | Takenouchi et al. | 357/2 X |
| 4,575,638 | 3/1986 | Okumura | 358/213.290 |
| 4,685,195 | 8/1987 | Szydlo et al. | 437/20 X |
| 4,845,375 | 7/1989 | Tsushima | 357/72 |

Primary Examiner—Rolf Hille
Assistant Examiner—Peter Toby Brown
Attorney, Agent, or Firm—Oblon, Spivak, McClelland, Maier & Neustadt

[57] ABSTRACT

A photoelectric conversion semiconductor device comprising photoelectric conversion elements, selection switching elements and a driving circuit for sequentially driving the photoelectric elements. The above structural elements are formed on an insulating and transparent substrate. The driving circuit including a plurality of one-bit shift registers each having one switch and two series-connected complementary metal oxide semiconductor (CMOS) inverters. An input signal of each one-bit shift register is supplied to one of the CMOS inverters. An output signal of the other of the CMOS inverters is supplied to a next stage of the one-bit shift register. One of the output signals of the two CMOS inverters is supplied to one of the selection switching elements.

8 Claims, 31 Drawing Sheets

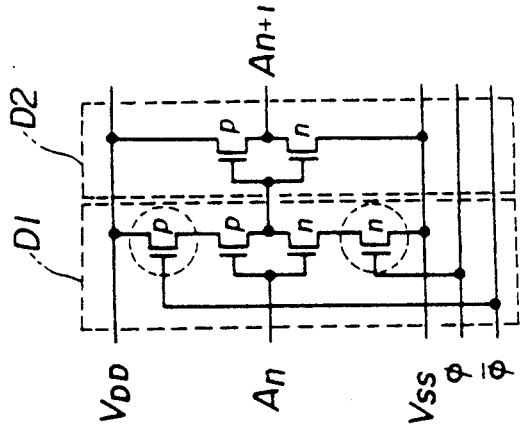
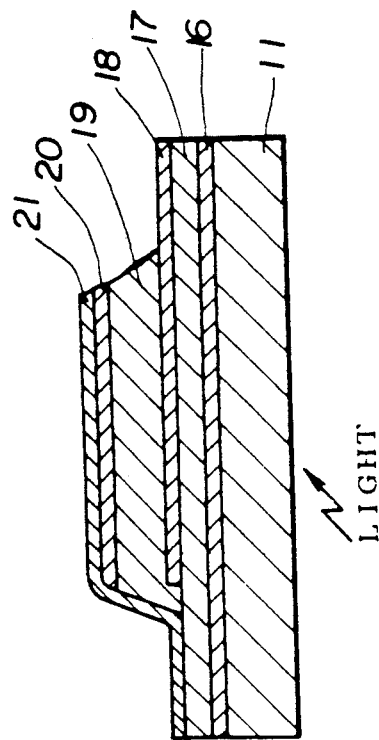
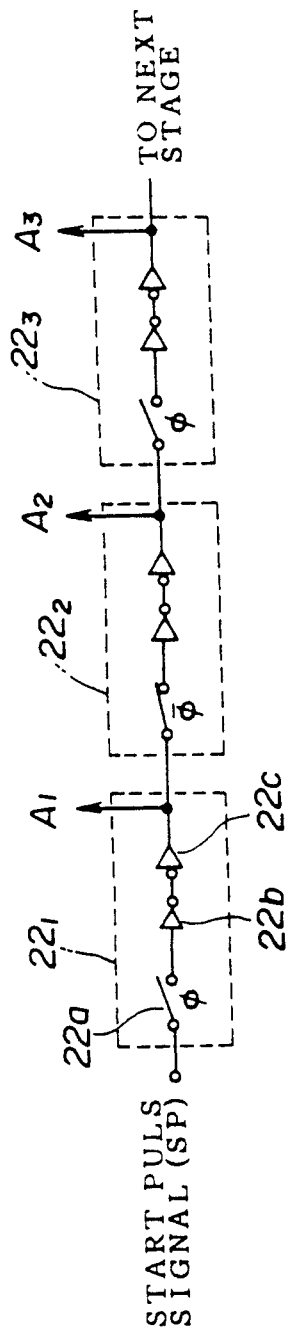

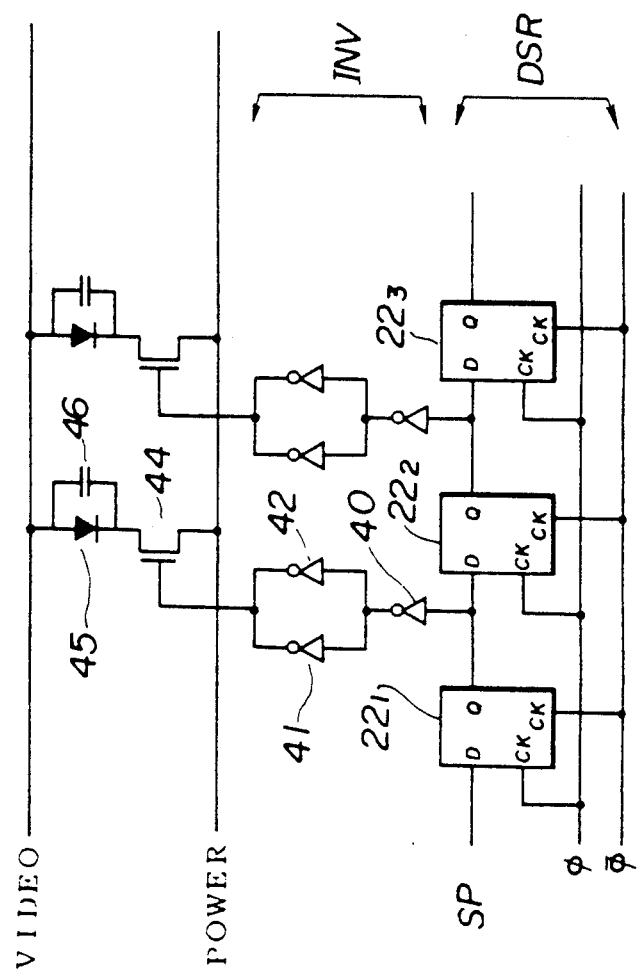

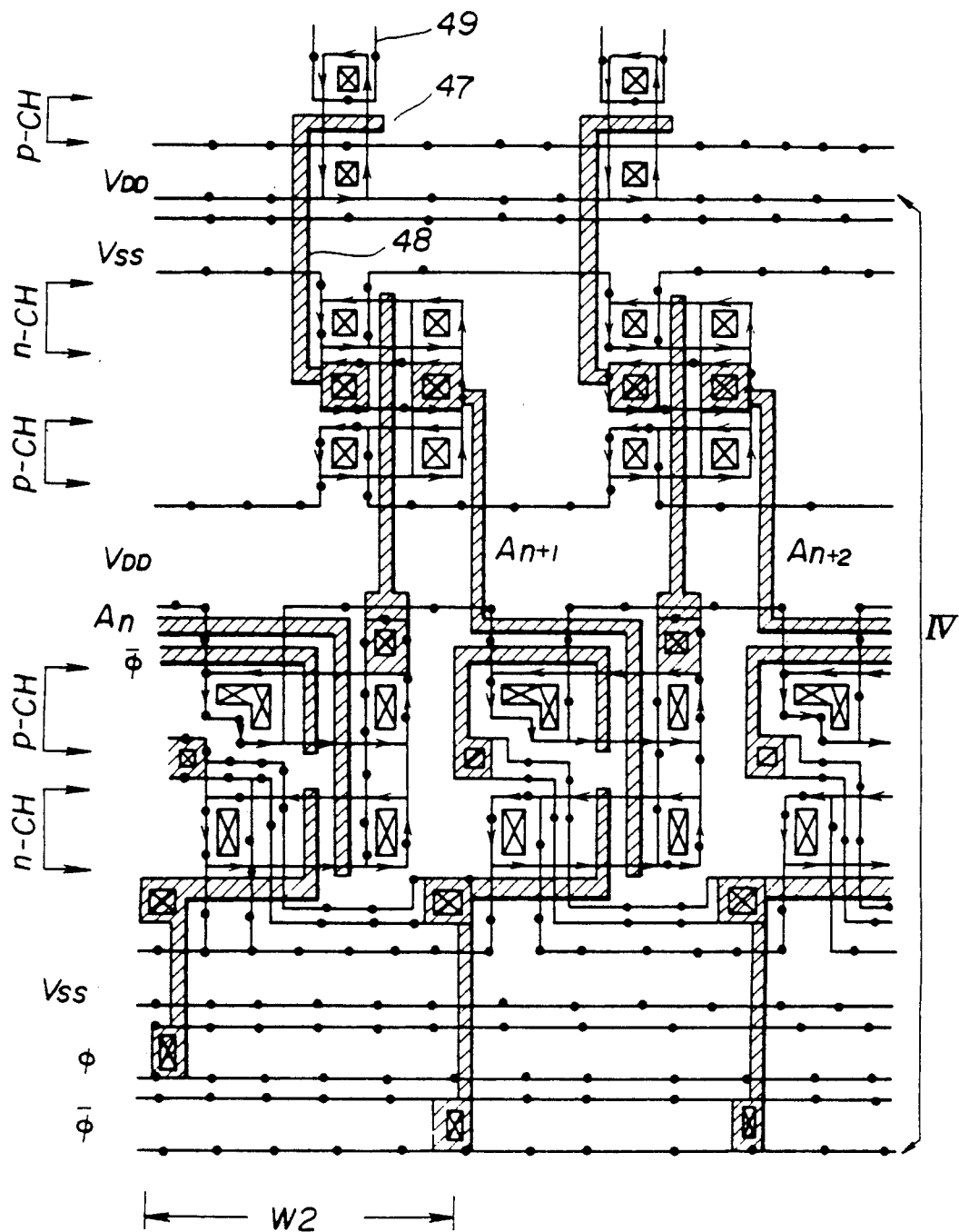

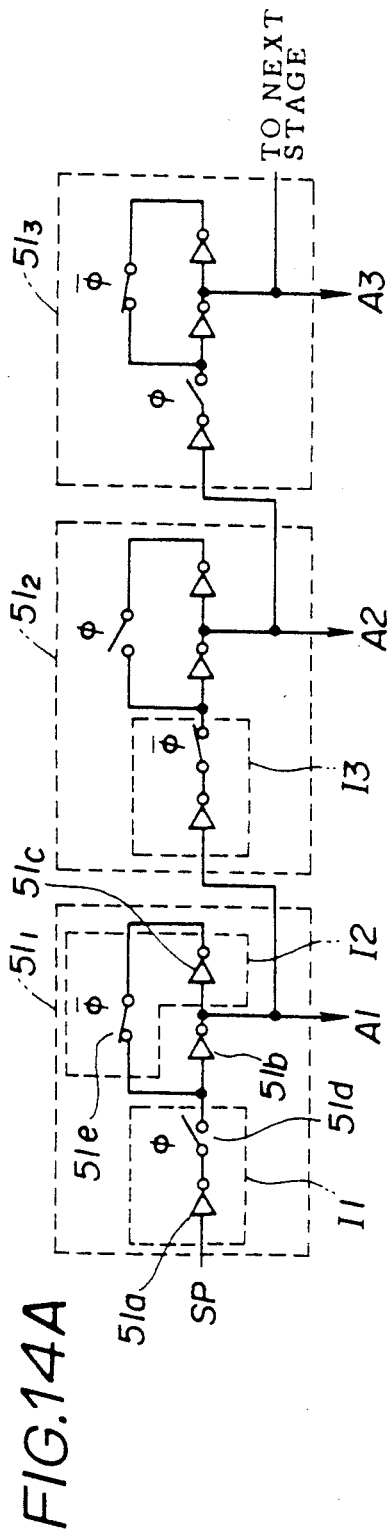
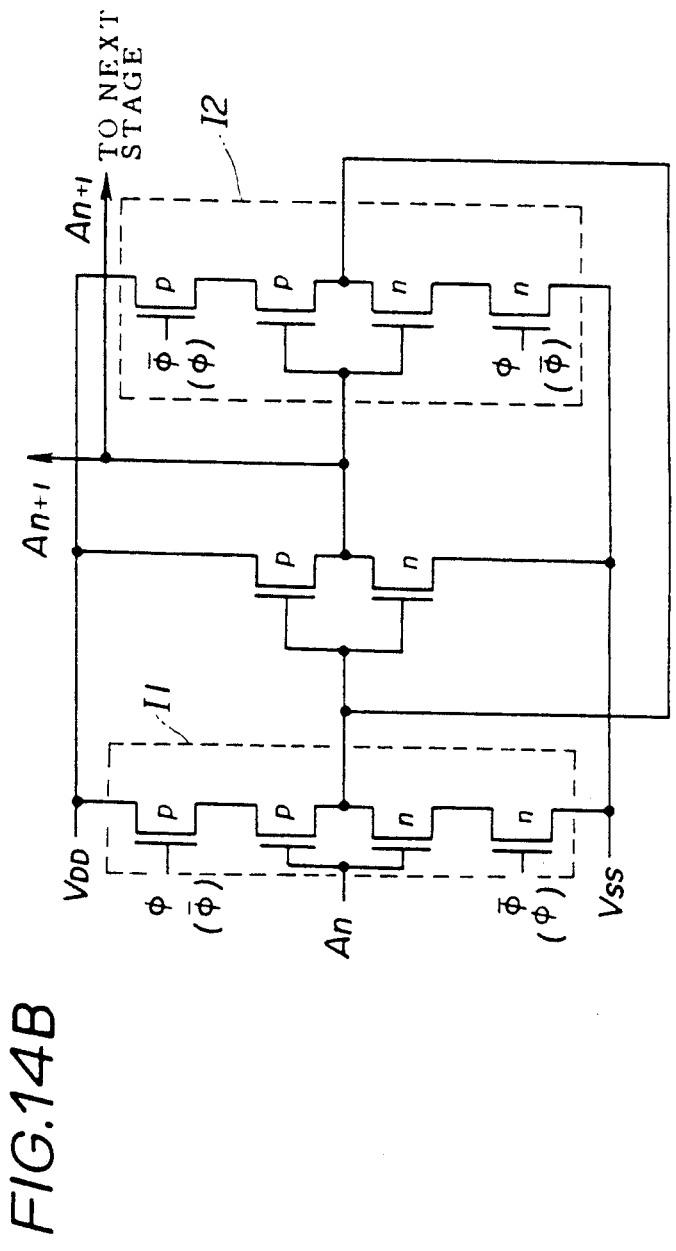
FIG.14A
FIG.14B

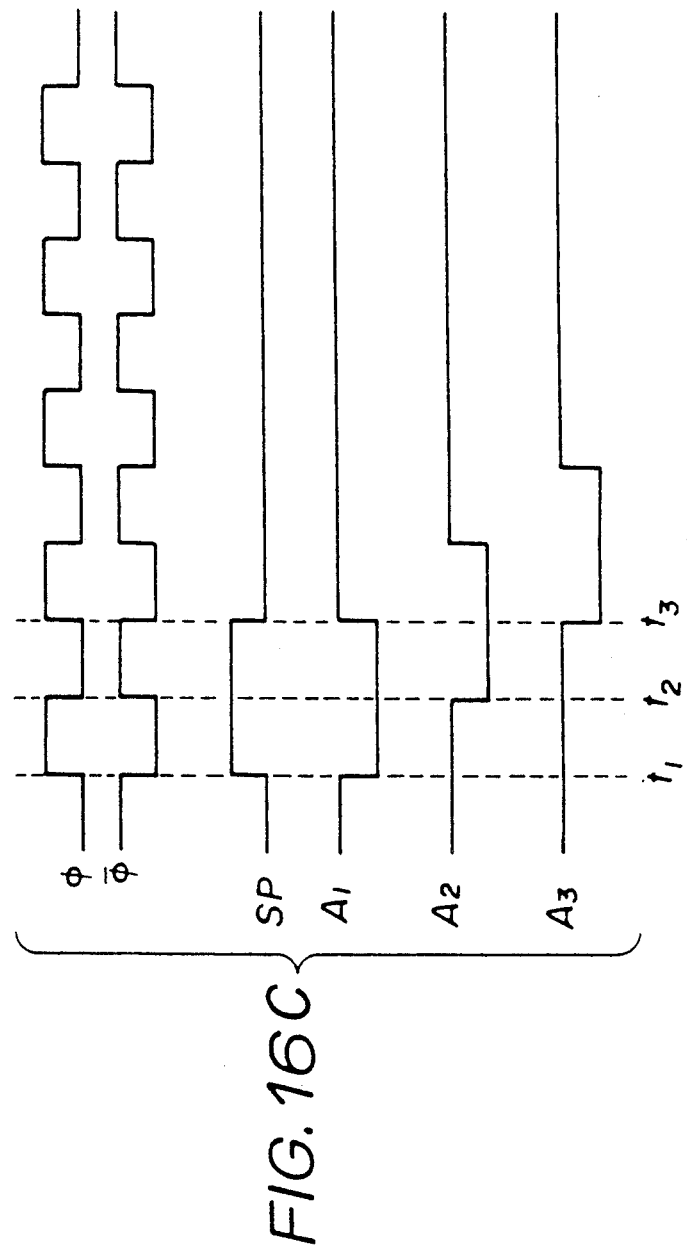

FIG.20B
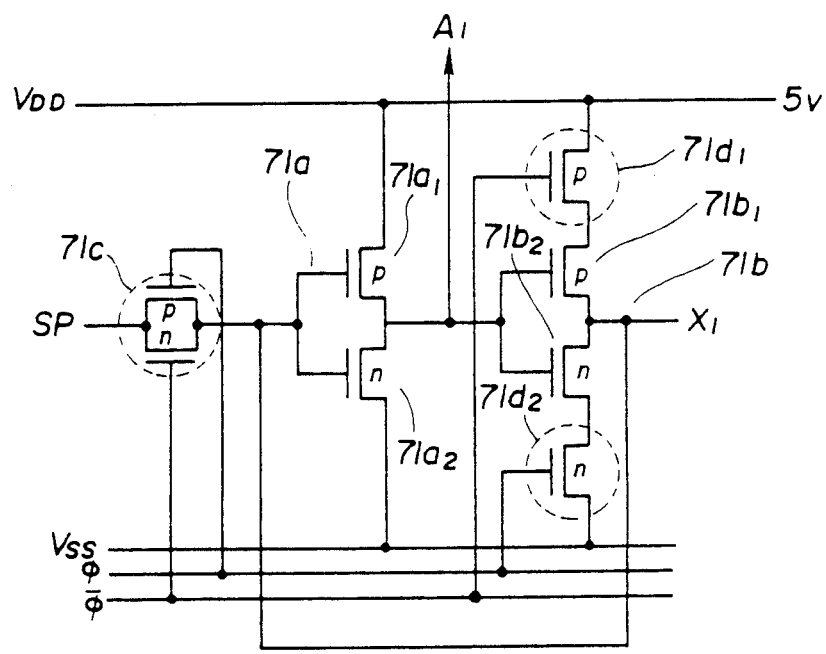
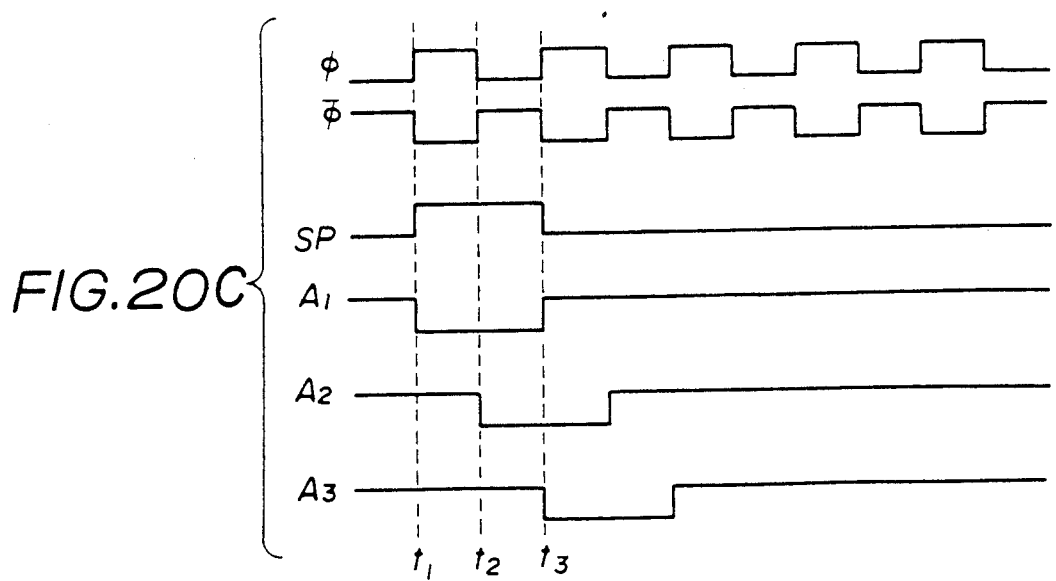
FIG.20C

FIG.22B
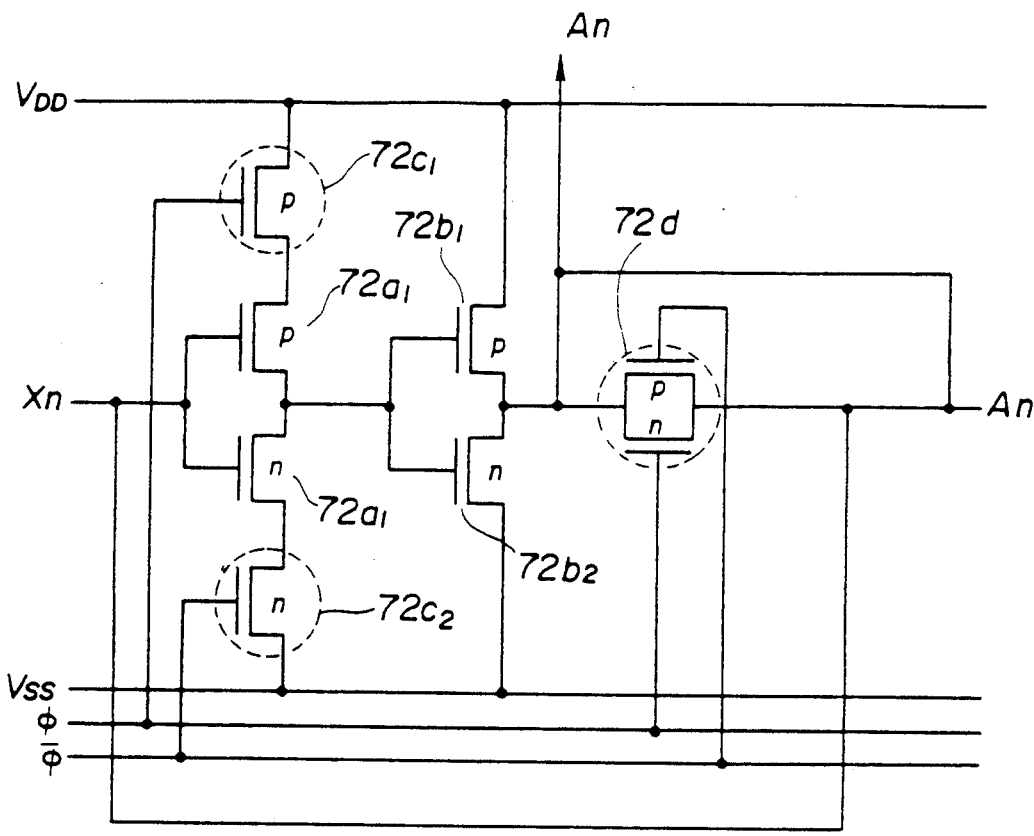
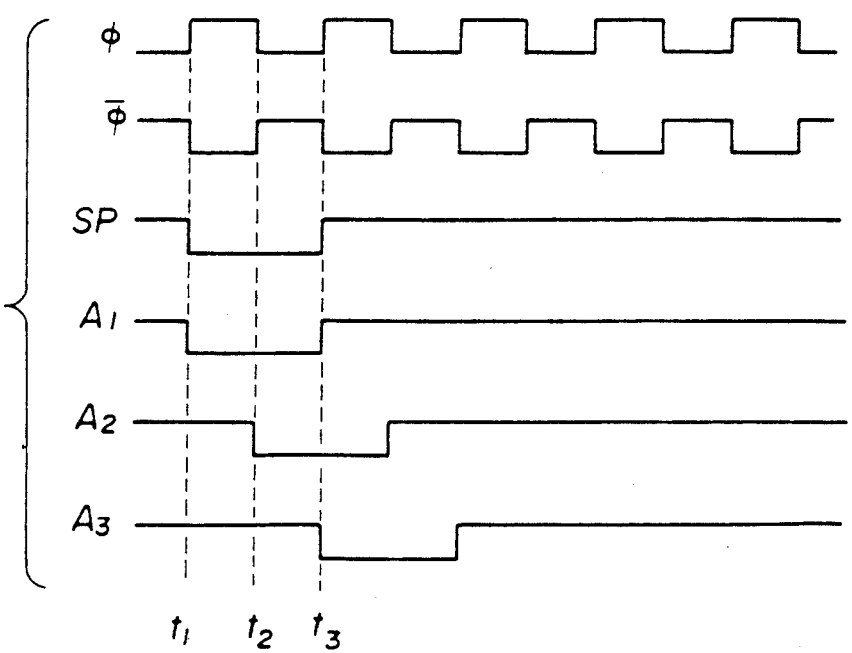
FIG.22C

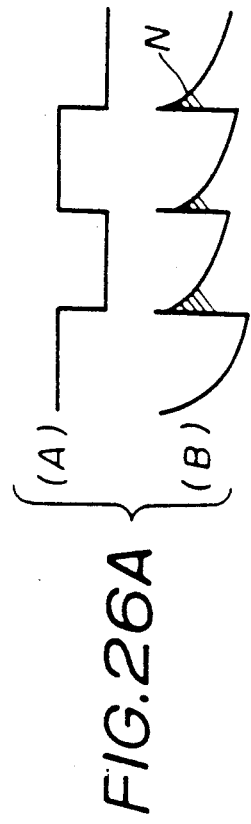
FIG.26A
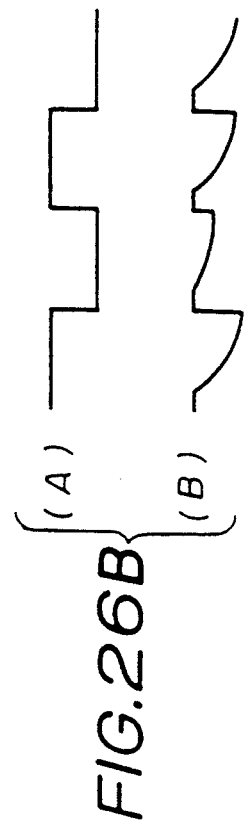
FIG.26B
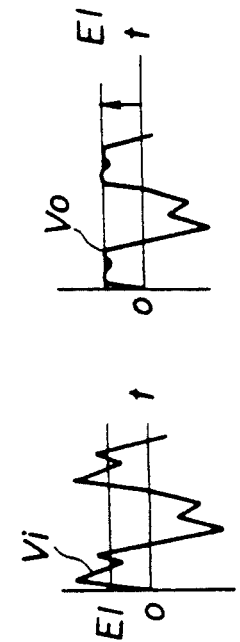
FIG.25A
FIG.25B
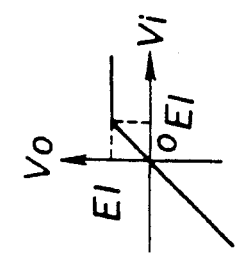
FIG.25C
FIG.25D
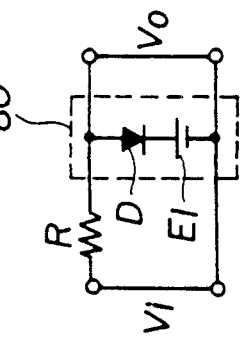

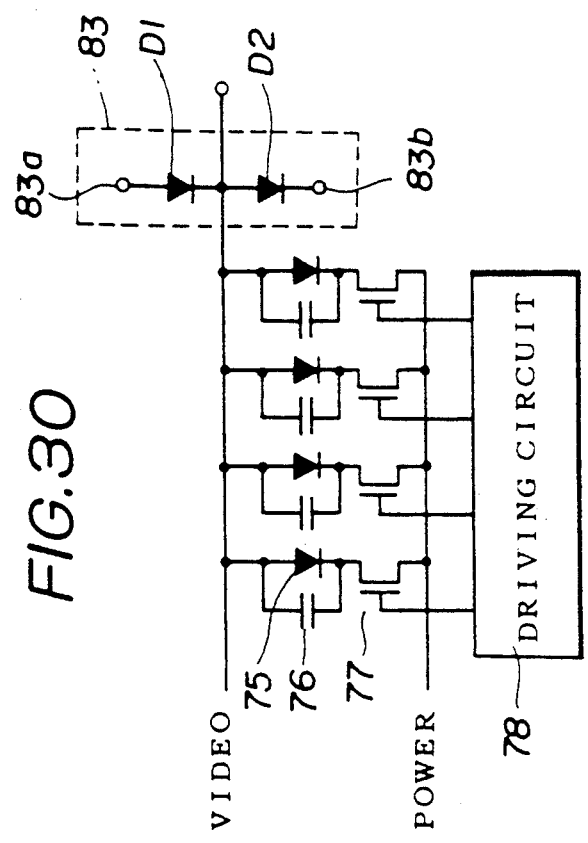
FIG. 30
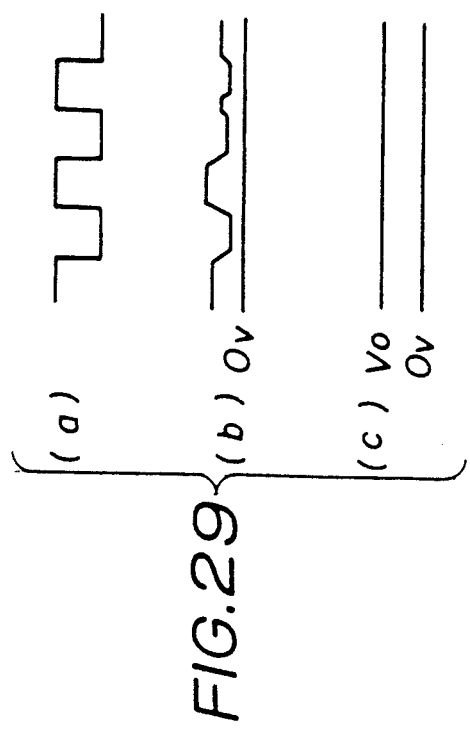
FIG. 29
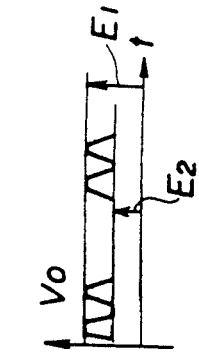
FIG. 31D
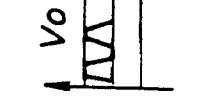
FIG. 31C
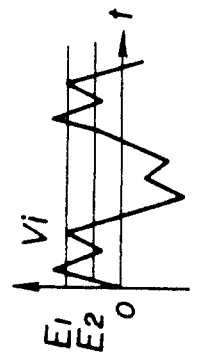
FIG. 31A
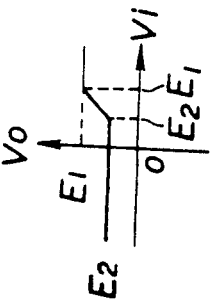
FIG. 31B
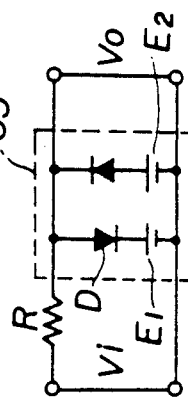
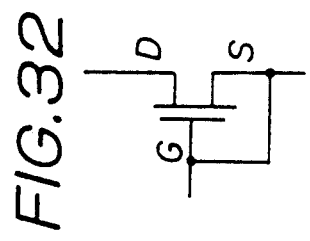
FIG. 32

PHOTOELECTRIC CONVERSION SEMICONDUCTOR DEVICE WITH NOISE LIMITING CIRCUIT

BACKGROUND OF THE INVENTION

The present invention generally relates to a photoelectric conversion semiconductor device, and in particular to a photoelectric conversion semiconductor device in which photoelectric conversion elements and a driving circuit for sequentially driving the photoelectric elements to read out data therefrom in sequence are formed on a single substrate.

Currently, various photoelectric conversion semiconductor devices have been proposed and marketed. One of the most popular examples of these is a contact-type line image sensor of a size corresponding to a size of a sheet of a paper to be optically scanned. The contact-type line image sensor is widely used as a photo sensor or an image sensor in a facsimile machine, a copying machine, an optical character reading apparatus, an electronic blackboard and the like. The contact type line image sensor has a plurality of photoelectric conversion elements formed in a line. Each of photoelectric elements includes as a photoelectric film, an amorphous film made of Cd-CdSe and Se-As-Te, for example.

Recently, a contact type line image sensor using amorphous Si has been proposed. Use of amorphous Si makes it possible to produce an image sensor of a relatively large size and a good responsibility of photoelectric conversion, compared to the image sensors using other amorphous materials. For example, there is proposed an amorphous Si: H image sensor of a sandwich type, in which an amorphous Si: H film is sandwiched between an upper transparent film and a lower transparent film.

Generally, in addition to the photoelectric elements, the image sensor is built with selection switching elements and a driving circuit. Each of the selection switching elements is coupled with the respective photoelectric elements which are aligned in a main scanning direction. The driving circuit is used to control ON/OFF states of the selection switching elements to read out data from the photoelectric elements in sequence. The driving circuit is generally constituted by a shift register. The shift register is made up of delay elements which are cascade-connected. Each of the delay elements supplies a sensor read signal to the respective selection switching elements coupled with the photoelectric elements.

Conventionally, the photoelectric elements, selection switching circuits and driving circuit are separately manufactured. They are mounted on a supporting base of the image sensor and electrically connected with each other. However, the above constitution of the image sensor has a disadvantage in that it is difficult to make image sensors of a compact size and the production process is complex. In addition, connection lines for connecting the photoelectric elements, the selection switching elements and the driving circuit together may be lengthened, which may cause noise in video signals read from the photoelectric elements.

In order to eliminate the above problems, there has also been a proposed image sensor in which the photoelectric elements, the selection switching circuits and the driving circuit are provided on a single insulating and transparent substrate. However, such a proposal does not include any detailed structure of the driving circuit nor a layout thereof on the substrate.

SUMMARY OF THE INVENTION

Accordingly, a general object of the present invention is to provide a novel and useful photoelectric conversion semiconductor device in which the above disadvantages have been eliminated.

A more specific object of the present invention is to provide a photoelectric conversion semiconductor device of a compact size in which selection switching elements and a driving circuit for sequentially driving the photoelectric elements which are all constituted by thin film transistors are formed on a single substrate together with photoelectric elements.

Another object of the present invention is to provide a photoelectric conversion semiconductor device including a driving circuit of a simple circuit configuration which is achieved by reducing the number of the thin film transistors.

Still another object of the present invention is to provide a photoelectric conversion semiconductor device including a driving circuit in which a layout of structural elements forming the driving circuit is designed so as to reduce the area taken by the layout.

A further object of the present invention is to provide a photoelectric conversion semiconductor device which includes a noise limiting circuit constituted by a thin film transistor.

The above objects of the present invention are attained by a photoelectric conversion semiconductor device comprising an insulating and transparent substrate; a plurality of photoelectric conversion elements formed in a line on the insulating and transparent substrate; selection switching elements comprising a plurality of first thin film transistors formed on the insulating and transparent substrate, for selecting photoelectric conversion elements; and a driving circuit comprising a plurality of second thin film transistors formed on the insulating and transparent substrate, for driving the photoelectric conversion elements through the selection switching elements; the driving circuit including a plurality of one-bit shift registers each having one switch and two series-connected complementary metal oxide semiconductor (CMOS) inverters, an input signal of each one-bit shift register being supplied to one of the CMOS inverters, an output signal of the other of the CMOS inverters being supplied to a next stage of the one-bit shift register, one of the output signals of the two CMOS inverters being supplied to one of the selection switching elements.

Other objects, features and advantages will become apparent from the following detailed description when read in conjunction with the accompanying drawings.

BRIEF DESCRIPTION OF THE DRAWINGS

FIG. 4 is a sectional view of a photoelectric conversion element formed on an insulating and transparent substrate;

FIG. 5 is an example of a driving circuit constituted by a shift register of the dynamic type;

FIG. 6 is a circuit diagram of one of a plurality of one-bit shift registers which are cascade-connected to form the driving circuit of FIG. 5;

FIG. 10C is an equivalent circuit corresponding to the circuit structure shown in FIG. 10A;

FIG. 11A shows a layout of still another example of photoelectric elements and their peripheral circuits;

FIG. 14A is a circuit diagram of an example of a driving circuit constituted by a shift register of the static type;

FIG. 14B is a circuit diagram of a one-bit shift register used in the constitution shown in FIG. 14A;

FIG. 16C is an operating time chart of the driving circuit shown in FIG. 16A;

FIG. 20B is a circuit diagram of a one-bit shift register used in the circuit shown in FIG. 20A;

FIG. 20C is an operating time chart of the driving circuit shown in FIG. 20A;

FIG. 22B is a circuit diagram of a one-bit shift register used in the circuit of FIG. 22A;

FIG. 22C is an operating time chart of the driving circuit shown in FIG. 22A;

FIGS. 25A through 25D are views for explaining the noise limiter shown in FIG.24;

FIGS. 26A and 26B show signal waveforms for explaining effects provided by the noise limiter shown in FIG. 24;

FIG. 29 shows signal waveforms for explaining effects provided by the noise limiter shown in FIG. 27;

FIG. 30 is a circuit diagram of a line image sensor in which still another noise filter is provided according to the present invention;

FIGS. 31A through 31D are views for explaining the noise limiter shown in FIG.30, and FIG. 32 is a circuit diagram of a diode used in the noise limiter according to the present invention.

DETAILED DESCRIPTION

Figure 1:
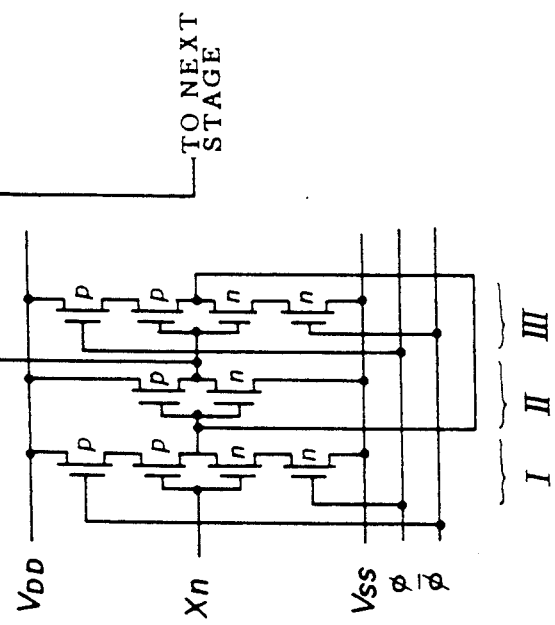
FIG. 1 is a circuit diagram of a conventional one-bit shift register.
Figure 2:
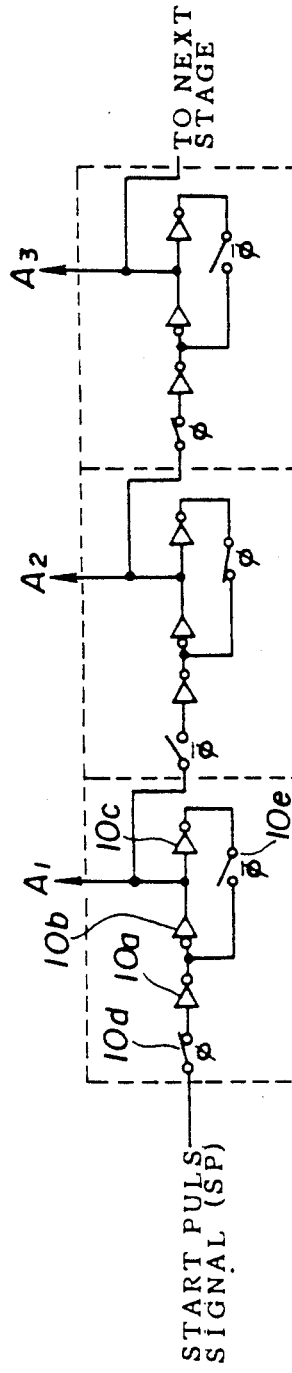
FIG. 2 is a circuit diagram of a conventional shift register in which a plurality of one-bit shift registers in FIG. 1 are cascade-connected.

To facilitate the understanding of the present invention, a conventional shift register which may be used as a driving circuit for photoelectric conversion elements in an image sensor, by referring to FIGS. 1 and 2.

FIG. 1 is a circuit diagram of a one-bit shift register. The illustrated one-bit shift register shifts an input $X_n$ by one bit in response to shift clock signals $\phi$ and $\bar{\phi}$, and thus produces an output signal $X_{n+1}$. The output signal $X_{n+1}$ is supplied to one of selection switching circuits each coupled with respective photoelectric conversion elements. As shown, the one-bit shift register consists of three inverters, i.e., two clocked complementary metal oxide semiconductor (hereafter simply referred to as clocked CMOS) inverters I and III, and a CMOS inverter II which is interposed therebetween. As seen from FIG. 1, the illustrated one-bit shift register is of a static type, in which an output signal of the clocked CMOS inverter III is fed back to an input of the CMOS inverter II. The one-bit shift register is driven by two shift clock signals $\phi$ and $\bar{\phi}$ having a phase difference of 180°. The clock signals $\phi$ and $\bar{\phi}$ are applied to the clocked CMOS inverters I and II.

A driving circuit for driving photoelectric conversion elements in sequence may be constituted by cascade-connecting a plurality of one-bit shift registers, as shown in FIG. 2. In this figure, inverters 10a, 10b and 10c correspond to the inverters I, II, and III in FIG. 1, respectively. Switches 10d and 10e correspond to the switches of the inverters I and III, respectively. In this arrangement, the one-bit shift registers are provided with the shift clock signals $\phi$ and $\bar{\phi}$ and are controlled as follows. The switches 10d and 10e in each of the one-bit shift registers are controlled by the shift clock signals of the phase difference of 180°. The switches 10d of the adjacent shift registers such as $10_1$ and $10_2$ are controlled by the clock signals $\phi$ and $\bar{\phi}$, respectively, and the switches 10e of the adjacent shift registers such as $10_1$ and $10_2$ are controlled by the clock signals $\bar{\phi}$ and $\phi$, respectively. Actually, each of the switches 10d and 10e receives both of the clock signals $\phi$ and $\bar{\phi}$, when they are constituted by CMOS transistors. Therefore, symbols $\phi$ and $\bar{\phi}$ attached to the switches shown in FIG. 2 mean that when the clock signal $\phi$ or $\bar{\phi}$ attached to the switch is held at a high-level, it is turned ON. This rule is true for the following description in the present specification. As described before, the shift register thus constituted and the photoelectric elements are separately produced, and then coupled with each other by use of connecting lines such as bonding wires.

However, the shift register described above is not suitable for the driving circuit which is mounted on a single semiconductor substrate on which there are also provided the photoelectric elements. That is, because a number of the MOS transistors (10 for the illustrated example) are used for building the one-bit shift register, it is difficult to form a driving circuit of a compact size.

As described previously, one of the objects of the present invention is to form a driving circuit of compact size by improving a circuit structure and/or a layout thereof formed on the substrate on which the photoelectric elements are formed.

A description will be given on an embodiment of a photoelectric conversion semiconductor device according to the present invention.

Figure 3:
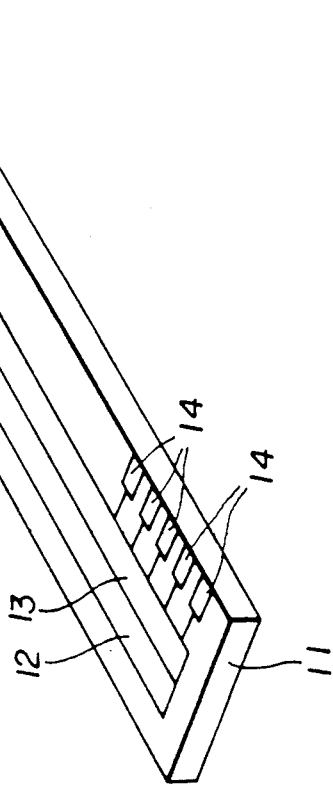
FIG. 3 is a perspective view of a photoelectric conversion semiconductor device according to the present invention.

Referring to FIG. 3, there is illustrated a contact type photoelectric conversion line image sensor according to the present invention. The image sensor comprises an insulating and transparent substrate 11 made of silica glass or the like. A photoelectric conversion element region 13 and a driving circuit region 12 are formed on an upper surface of the substrate 11. A plurality of photoelectric conversion elements are aligned in the region 13 in a main scanning direction of the image sensor. A length of the photoelectric element region 13 in the main scanning direction substantially corresponds to a size of a sheet of a paper or the like to be scanned. In other words, the number of the photoelectric elements depends on the maximum size of the sheet to be scanned. A shift register is formed in the driving circuit region 12. A length of the driving circuit region substantially corresponds to that of the photoelectric element region 13. A plurality of metallic terminals 14 through which electrical video signals from the photoelectric elements are obtained, are provided on the upper surface of the insulating substrate 11.

FIG. 4 is a sectional view of a photoelectric element provided in the photoelectric element region 13 shown in FIG. 3. A protection insulating film 16 is provided on the upper surface of the insulating and transparent substrate 11. The protection insulating film 16 may be made of $SiO_2$ or $Si_3N_4$ (silicon nitride), for example. An insulating film 17 is provided on the upper surface of the protection insulating film 16. The insulating film 17 may be made of $SiO_2$, $Si_3N_4$ or amorphous Si: H (hereafter simply referred to a-Si: N). A metallic electrode 18 which may be made of Cr is provided on the upper surface of the insulating film 17. A semiconductor film 19 is provided on the metallic electrode 18 and a part of the upper surface of the insulating film 17. The semiconductor film 19 may be made of a-Si: N, for example. A semiconductor film 20 made of a-Si: OH or the like is provided on the upper of the semiconductor film 19 as a protection layer. A transparent electrode 21 is provided on the upper of the semiconductor film 20 and a part of the upper surface of the insulating film 17. The transparent electrode 21 may be made of ITO (indium tin oxide), for example. A protection layer (not shown) may be provided over the photoelectric element.

The semiconductor film 19 which is a photoelectric layer is sandwiched between the upper and lower electrodes 21 and 18. Therefore, the photoelectric element of the illustrated structure is called a sandwich type. Light is projected from the bottom side of the photoelectric element.

FIG. 5 is a circuit diagram of an example of a driving circuit used in the present invention. Referring to FIG. 5, the driving circuit is composed of a plurality of one-bit shift registers $22_1$, $22_2$, $22_3$, . . . which are cascade-connected. Each of the one-bit shift registers is made up of two inverters 22b and 22c which are connected to each other in series, and a switch 22a. Output signals $A_1$, $A_2$ and $A_3$ of the one-bit shift registers $22_1$, $22_2$ and $22_3$ are used as a driving signal or sensor read signal. The signals A1, A2, and A3 are also supplied to the next one-bit shift register. The switches 22a of the adjacent one-bit shift registers are controlled by shift clock signals $\phi$ and $\bar{\phi}$ having a mutual phase difference of 180°. As seen from the above description, the one-bit shift registers shown in FIG. 5 are dynamic shift registers.

FIG. 6 is a circuit diagram of one of the one-bit shift registers in FIG. 5. The illustrated one-bit shift register has the switch 22a which is activated by the clock signal $\bar{\phi}$. Blocks D1 and D2 indicated by broken lines correspond to the switch 22a and inverter 22b, and the inverter 22c, respectively. The switch 22a and the inverter 22b are constituted by a clocked CMOS inverter in the block D1, and the inverter 22c is constituted by a CMOS inverter in the block D2, as shown in FIG. 6. In the clocked type CMOS inverter, supply of power to the CMOS inverter part is controlled by the switch 22a composed of p-channel and n-channel MOS transistors which are respectively located between power supply lines $V_{DD}$ and $V_{SS}$ and the CMOS inverter in the block D1. The MOS transistors making the switch 22a are indicated by circles of broken lines in FIG. 6. In the illustrated circuit, the shift clock signals $\bar{\phi}$ and $\phi$ are supplied to the p-channel and n-channel MOS transistors of the switch 22a, respectively. The p-channel and n-channel MOS transistors of the switch in the one-bit shift register next to the shift register of FIG. 5 are provided with the shift clock signals $\phi$ and $\bar{\phi}$. Therefore, $\phi$ or $\bar{\phi}$ attached to the switch 22a in FIG. 5 indicates that when the clock signal $\phi$ or $\bar{\phi}$ is kept at the high-level, the related switch is in ON state. The clocked CMOS inverter of FIG. 6 inverts an input signal $A_n$ when the shift clock signal $\phi$ is changed in to the high-level. The inverted signal is further inverted by the following CMOS inverter in the block D2, so that an output signal $A_{n+1}$ which has been shifted by one bit with respect to the signal $A_n$ is outputted.

It is noted that a one-bit shift register of FIG. 5 is constituted by 8 MOS transistors, whereas the one-bit shift register of FIG. 1 is constituted by 10 MOS transistors. As a result, the reliability of the image sensor can be improved, and the yield rate on the manufacture process can be also improved.

Figure 7A:
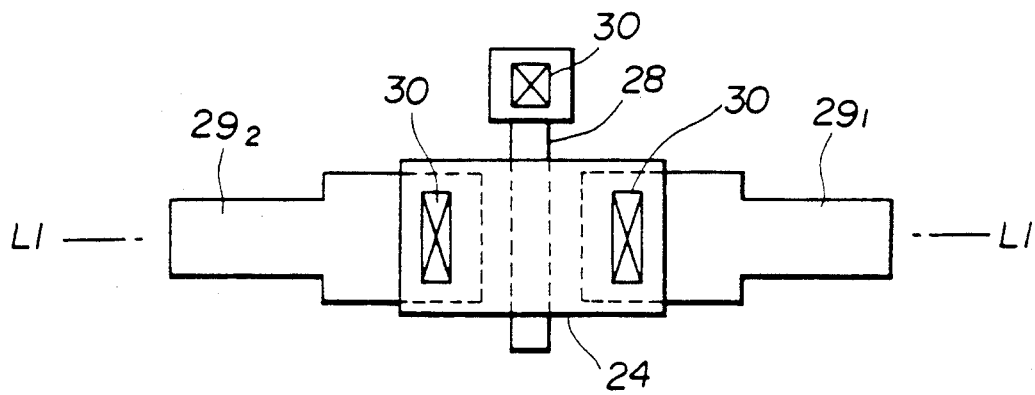
FIG. 7A is a plan view of a MOS transistor used in the circuit shown in FIG. 6.
Figure 7B:
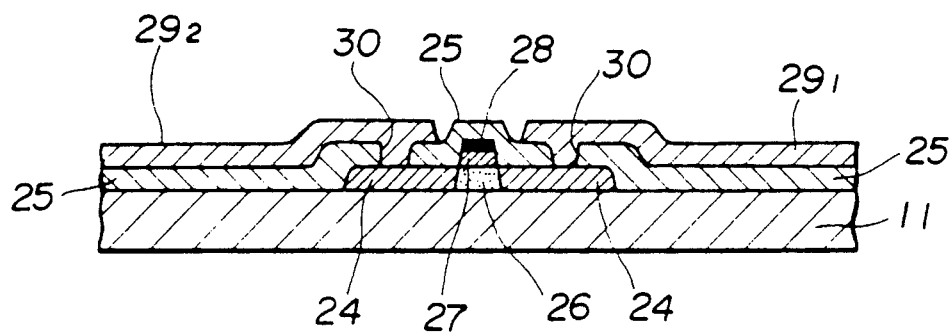
FIG. 7B is a cross sectional view taken along a line L1—L1 shown in FIG. 7A.

FIG. 7A is a plan view of the MOS transistor used in the shift register shown in FIG. 6, and FIG. 7B is a cross sectional view taken along a line L1—L1 shown in FIG. 7A. MOS transistors are thin film transistors (TFT) of a silicon-on-insulator (SOI) structure, as described below. Diffusion layers 24 are provided on the upper surface of the insulating and transparent substrate 11 which is also the substrate for the photoelectric element described previously. The diffusion layers 24 may be made of impurity doped polysilicon. For example, a p-type diffiusion layer is available by doping of B (boron), and an n-type diffusion layer is available by doping of P (phosphorus). An active layer 26 is formed on the upper surface of the substrate 11 which is sandwiched between the diffusion layers 24 on the upper surface of the substrate 11. The active layer 26 may be formed by polysilicon, for example. A gate oxide film 27 is provided on the upper of the active layer 26. The gate oxide film 27 may be made of $SiO_2$, for example. On the upper of the oxide film 27, there is provided a gate electrode 28, which may be made of polysilicon, for example. A layer-to-layer insulating film 25 is provided on the configuration thus formed. Contact holes 30 are formed in the insulating layer 25. Metallic electrodes $29_1$ and $29_2$ are deposited on the insulating layer 25 except for the insulating layer part on the gate electrode 28, as shown in FIGS. 7A and 7B. Ohmic contacts are formed at an interface between the diffusion layers 24 and the metallic electrodes $29_1$ and $29_2$. The electrodes $29_1$ and $29_2$, which may be made of Al for example, acts as source or drain electrodes. Further, a passivation (not shown) may be provided over the device of FIGS. 7A and 7B.

Figure 8:
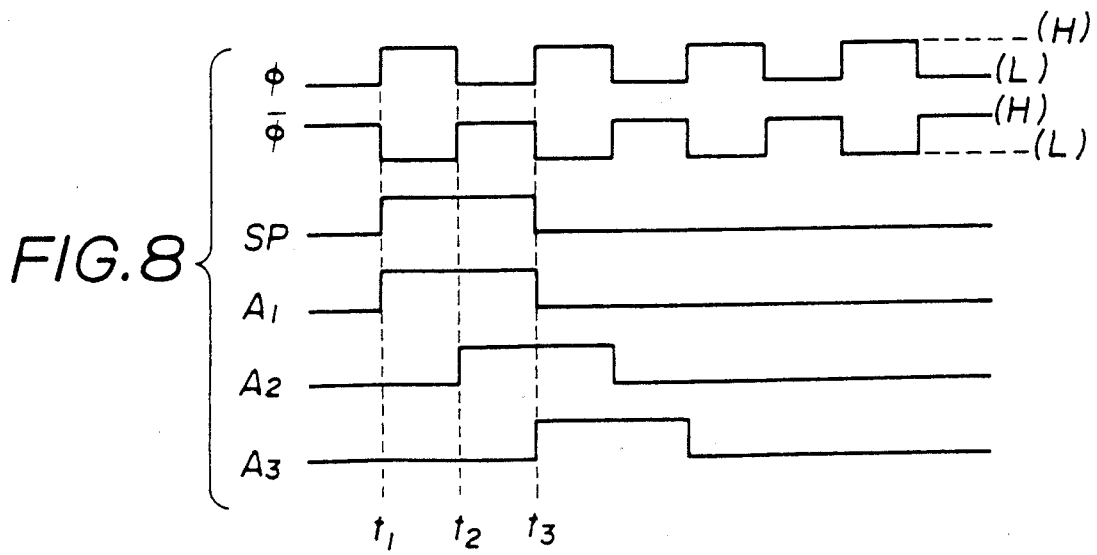
FIG. 8 is an operating time chart of the driving circuit shown in FIG. 5.

FIG. 8 is an operating time chart of the shift register shown in FIG. 5 s described before, the shift clock signals $\phi$ and $\bar{\phi}$ which are fed to each of the one-bit shift registers have a mutual phase difference of 180°. In the illustrated time chart, the levels of the clock signals $\phi$ and $\bar{\phi}$ are made high (H) and low (L) at a time $t_1$, respectively. When a start pulse SP is applied to the first one-bit shift register $22_1$ at the time $t_1$, the shift register $22_1$ produces the output signal A1 of the high-level. At this time, the switch 22a is closed. When the clock signals $\phi$ and $\bar{\phi}$ switch from the high and low-levels to low and high-levels at a time $t_2$ respectively, the switch 22a of the one-bit shift register $22_1$ is opened, whereas the switch 22a of the one-bit shift register $22_2$ is closed. Because a parasitic capacity exists at the output of each of the one-bit shift registers, the output signal A1 of the one-bit shift register $22_1$ keeps the level high for a certain period after the time $t_1$, even when the switch is opened. For simplicity, the time chart is drawn so that the one-bit shift register $22_1$ keeps its output high until a time $t_3$. In this manner, the signal A1 of the high-level is supplied to the clocked CMOS inverter of the one-bit shift register $22_2$, which produces the output signal A2 of the high-level. Then, when the clock signals $\phi$ and $\bar{\phi}$ switches to the low and high-levels again at the time $t_3$, respectively, the one-bit shift register $22_3$ switches from low-level to high-level. In this manner, the start pulse SP is shifted in response to the shift clock signals $\phi$ and $\bar{\phi}$. The output signals $A_1$, $A_2$, $A_3$, ... of the one-bit shift registers $22_1$, $22_2$, $22_3$, ... are fed to the respective selection switching elements coupled with the photoelectric elements.

Figure 9:
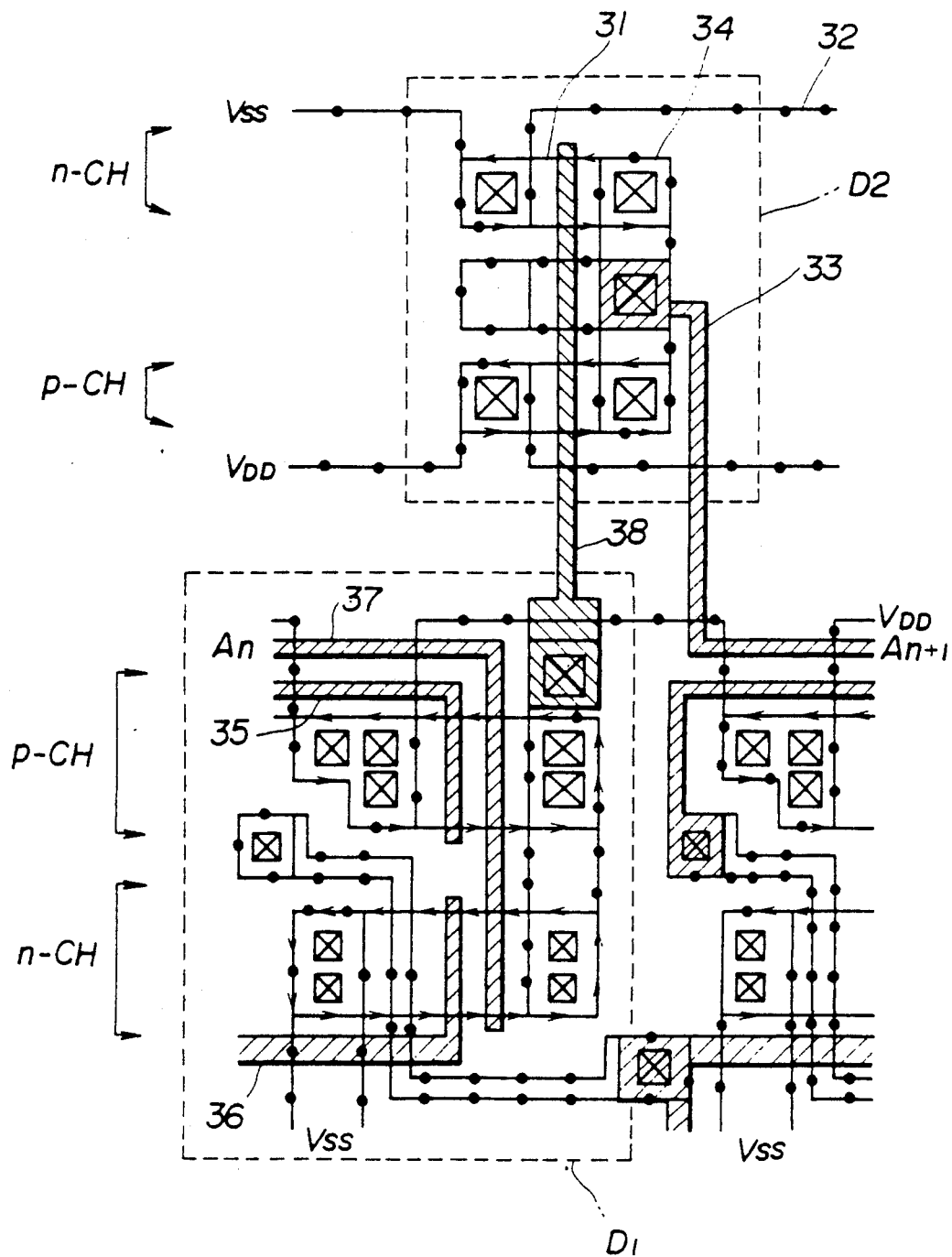
FIG. 9 shows a layout of the circuit of FIG. 6 formed on the insulating and transparent substrate.

FIG. 9 shows a layout of the one-bit shift register shown in FIG. 5. Referring to this figure, the broken line block D1 corresponds to the block D1 in which the clocked CMOS inverter is provided, and the broken line block D2 corresponds to the block D2 in which the CMOS inverter is provided. In FIG. 9, a region surrounded by a line including arrows such as a line 31 denotes an active layer such as the active layer 26 shown in FIG. 7B, a region surrounded by a line including black dots such as a line 32 denotes a metallic layer such as the layers $29_1$ and $29_2$, a region of hatching, a region 33 for example, denotes a polysilicon region such as the gate electrode 28, and a region having X, a region 34 for example, denotes an ohmic contact region such as the regions 30.

As seen from FIG. 9, two p-channel MOS transistors are formed in a p-channel region of the block D1, and two n-channel MOS transistors are formed in an n-channel region. In the illustrated constitution, the clock signals $\bar{\phi}$ and $\phi$ are applied to the p-channel and n-channel MOS transistors forming the switch 22a shown in FIG. 5 through polysilicon regions 35 and 36, respectively. The input $A_n$ is supplied to the p-channel and n-channel MOS transistors forming the inverter 22b through polysilicon region 37. THe output of the clocked CMOS inverter in the block D1 is supplied to the input of the CMOS inverter in the block D2 through a polysilicon gate 38. The output signal $A_{n+1}$ from the block D2 is fed to the input of the next stage through the polysilicon gate 33.

Figure 10A:
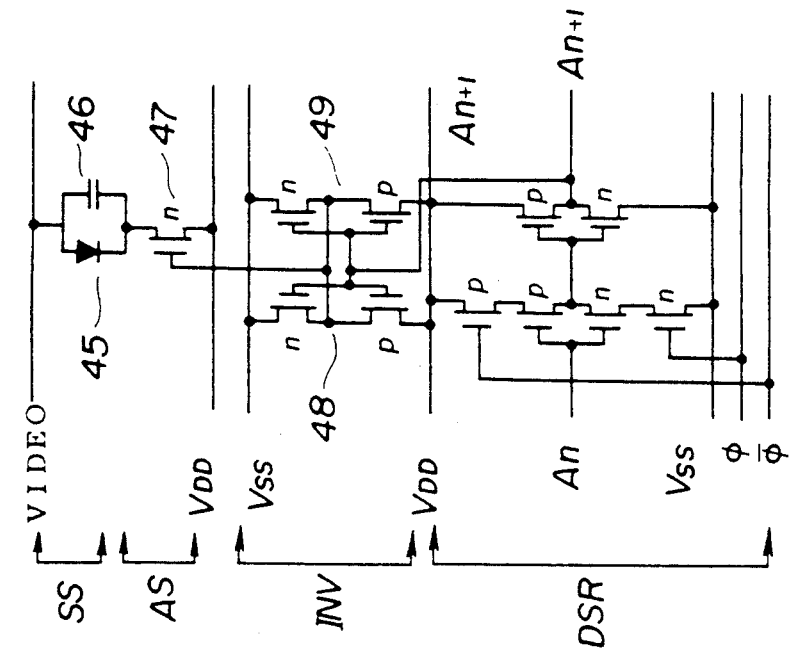
FIG. 10A is a circuit diagram of an example of one photoelectric element and circuits in its vicinity.

FIG. 10A is a circuit diagram of a circuit structure relating to one of the photoelectric elements of the contact type line image sensor according to the present invention, in which the shift register shown in FIG. 5 is used. In this figure, the one-bit shift register is denoted by DSR. An output signal $A_n$ of the one-bit shift register is supplied to an inverter circuit INV, which is made up of three CMOS inverters 40, 41 and 42. An output of the inverter circuit INV is fed to a selection switching element AS of an analog type constituted by a p-channel MOS transistor 44 through a line 43. THe drain of the p-channel MOS transistor 44 is connected to the $V_{DD}$ power supply line, the source of which is connected to the cathode of a photoelectric element (photo diode) 45 and a terminal of a capacitor 46. The anode of the photoelectric element 45 and the other terminal of the capacitor 46 are connected to a video line VIDEO. The combination of the photoelectric element 45 and the capacitor 46 make a photo sensor SS of one bit.

In operation, before reading a datum of the photo sensor SS, the capacitor 46 is pre-charged. At this time, the output signal $A_n$ of the one-bit shift register DSR is kept at the high-level. The signal $A_{n+1}$ of the high-level is then applied to the gate of the selection switching element AS through the inverter circuit INV. Accordingly, the switching element AS is turned ON, so that the charge from the power line $V_{DD}$ is stored in the capacitor 46. After that, when reading the datum of the photo sensor SS, the selection switching element AS is turned ON again at the time when the level of the output signal $A_{n+1}$ is made high. At this time, an amount of the current from the capacitor 44 to the video line VIDEO depends on whether or not the image sensor SS senses light, which is light reflected on a sheet of a paper (not shown), for example. In this manner, the datum of the photo sensor SS can be read and supplied to a signal processing circuit (not shown) through the video line.

Figure 10B:
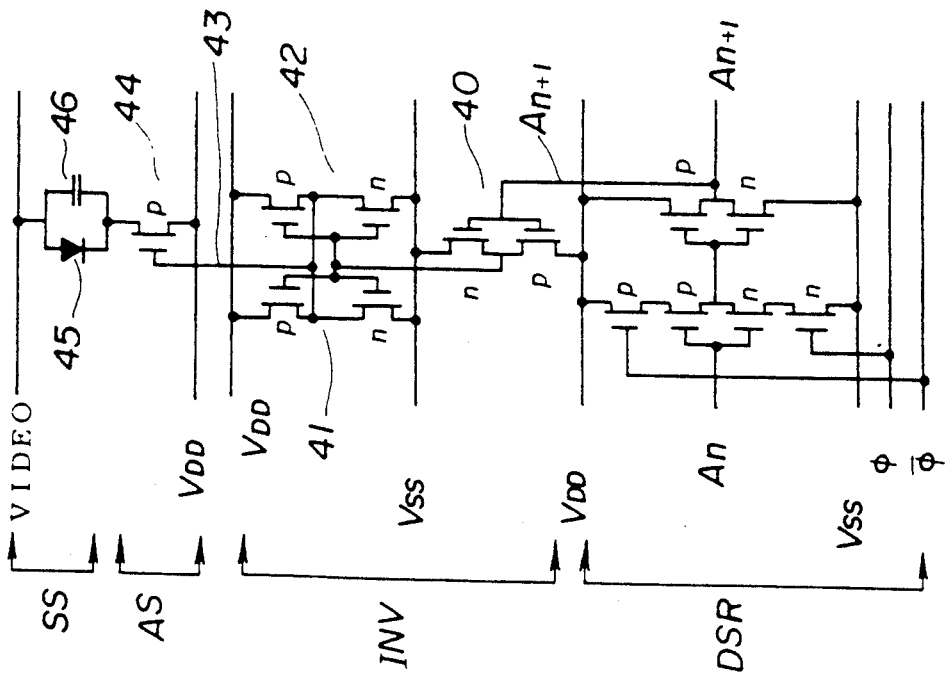
FIG. 10B is a circuit diagram of another example of one photoelectric element and circuits in its vicinity.

FIG. 10B is another circuit diagram relating to one of the photoelectric elements of the contact type line image sensor according to the present invention, in which the shift register shown in FIG. 5 is used. In this constitution, an n-channel MOS transistor 47 is used as the analog selection switching circuit AS in place of the p-channel MOS transistor 44 in FIG. 10A. Correspondingly, the inverter circuit INV is made up of two CMOS inverters 48 and 49 having a channel type different from that for the inverter circuit INV of FIG. 10A. The other structural parts in FIG. 10B are the same as those in FIG. 10A.

The circuit structure shown in FIG. 10A can also be represented as shown in FIG. 10C, in which the one-bit shift registers correspond to D-type flip-flops. In FIG. 10C, POWER denotes $V_{DD}$ for the selection switching elements 44.

Figure 11B:
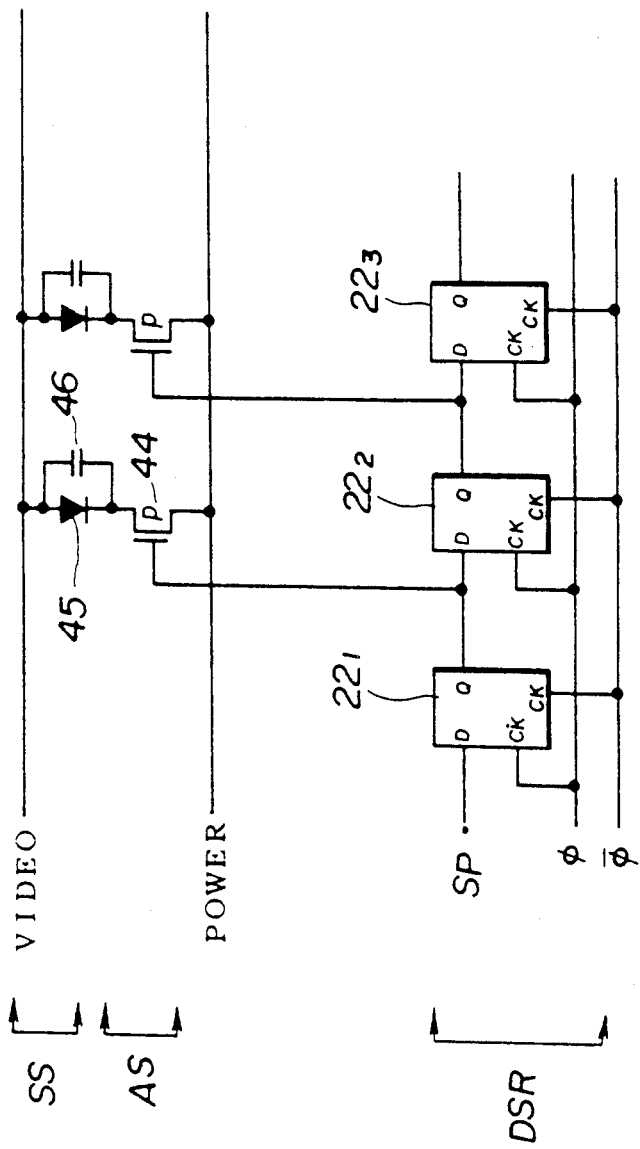
FIG. 11B is a circuit diagram corresponding to the layout shown in FIG. 11A.

FIG. 11A shows another layout on the substrate 11 relating to two of the photoelectric elements of the contact type line image sensor according to the present invention, and FIG. 11B shows a circuit structure corresponding to the layout shown in FIG. 11A. In the illustrated layout, the inverting circuit INV which is used in the constitution shown in FIG. 10A is not provided and, as shown in FIG. 11B, the output signal of the one-bit shift register is supplied directly to the input of the selection switching element AS. In FIG. 11A, a part IV of the layout is the same as the layout shown in FIG. 9. The output of the CMOS inverter in the one-bit shift register is connected to the gate of the p-channel CMOS transistor 47 of the selection switching element AS by means of a polysilicon region 48. The source of the p-channel CMOS transistor 47 is connected to the cathode of the photoelectric element 45 through a metallic region 49.

Figure 12A:
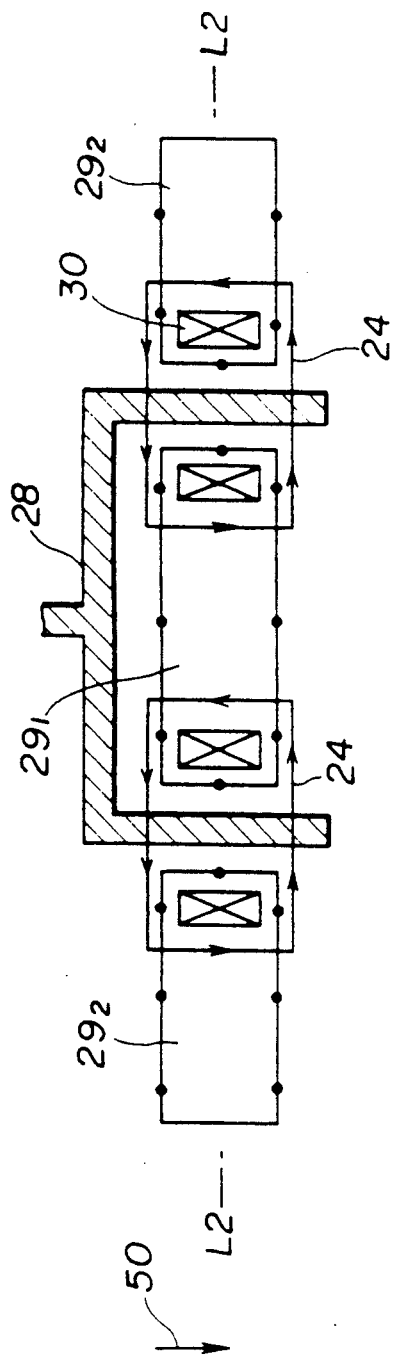
FIG. 12A is a plan view of a CMOS inverter used in the present invention.
Figure 12B:
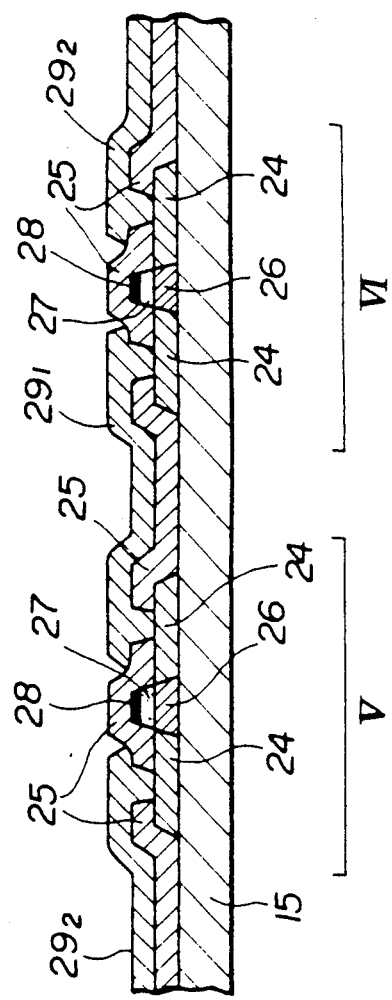
FIG. 12B is a cross sectional view taken along a line L2—L2 shown in FIG. 12A.

FIG. 12A is a plan view of another layout of the CMOS transistor used in the driving circuit shown in FIG. 5, and FIG. 12B is a cross sectional view taken along a line L2—L2 shown in FIG. 12A. One of the features of the illustrated arrangement is that the layout is designed so that the gate electrode of each MOS transistor extends in a direction of an arrow 50 which is the same as the main scanning direction of the line image sensor. In other words, the gate electrode extends parallel to the power lines such as $V_{dd}$ and $V_{SS}$ which also extend in the main scanning direction.

EAch of two MOS transistors V and VI illustrated in FIGS. 12A and 12B have the cross section which is the same as that shown in FIG. 7B. For this reason, a detailed description of these is omitted here. The two MOS transistors V and VI constitute one CMOS transistor, and thus the channel types of the diffusion regions 24 of the transistors V and VI are different from each other.

Figure 13:
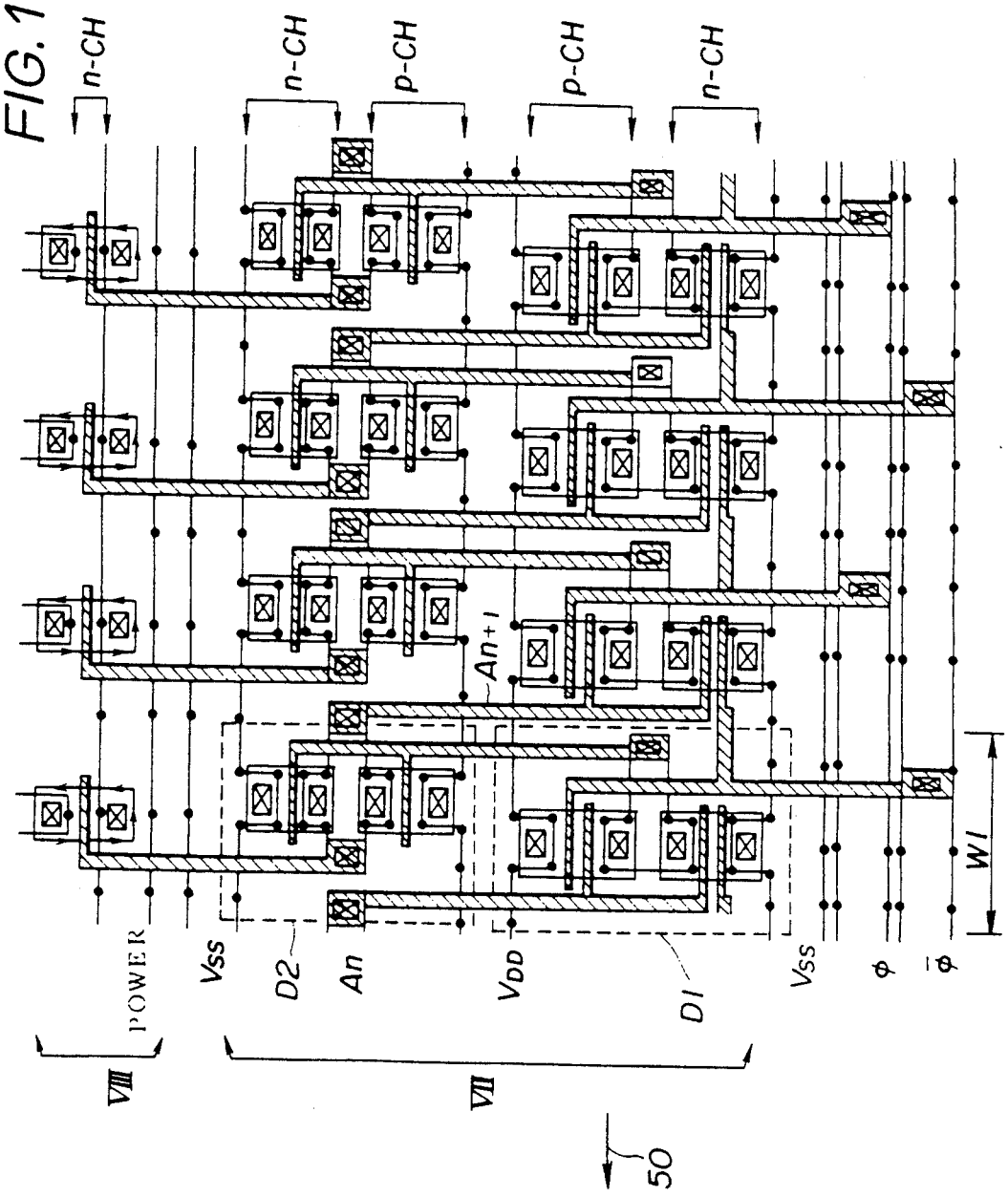
FIG. 13 is a layout of a configuration of photoelectric elements and their peripheral circuits, which are formed by use of the CMOS inverters shown in FIGS. 12A and 12B.

FIG. 13 shows a layout formed on the substrate 15 corresponding to the circuit structure shown in FIG. 11B, by use of the configuration shown in FIGS. 12A and 12B. In this figure, VII indicates a region where the driving circuit of the dynamic shift register is formed, and VIII indicates a region where the selection switching elements are formed. Each of the one-bit shift registers has the circuit structure shown in FIG. 6. In the region VII, the broken line blocks D1 and D2 correspond to the blocks D1 and D2 shown in FIG. 6, respectively. As seen from FIG. 13, gate electrodes of the MOS transistors extend in the direction of the arrow 50 which is the main scanning direction of the image sensor. In other words, the gate electrodes extend parallel to the power supply lines $V_{SS}$ and $V_{DD}$ and shift clock lines $\phi$ and $\bar{\phi}$ formed by the metallic regions. The n-channel transistors which are formed in the region VIII and operate as the selection switching elements, have the layouts identical to those in the region VII. Compared to FIG. 11A, it can be seen that a width W1 of the one-bit shift register in FIG. 13 is smaller than a width W2 of the one-bit shift register in FIG. 11A. That is, the arrangement of FIG. 13 makes it possible to reduce the width of the driving circuit in the main scanning direction. According to the arrangement of FIG. 13, the width of each of the one-bit shift registers may be made narrower than that of each of the photoelectric elements (not shown in FIG. 13), and thus a line image sensor of more compact size can be obtained.

A description will be given on another configuration of the driving circuit, by referring to FIGS. 14A through 14C, 15 and 16.

FIG. 14A is a circuit diagram of another configuration of the driving circuit. As shown, the driving circuit consists of one-bit shift registers $51_1$, $51_2$, $51_3$, ... which are cascade-connected. Each of the one-bit shift registers includes three inverters 51a, 51b and 51c as well as two switches 51d and 51e. The start pulse SP is supplied to the inverter 51a, the output signal of which is fed to the inverter 51b through the switch 51d. The output signal A1 of the inverter 51b is supplied to the inverter 51c. The output of the inverter 51c is fed back to the input of the inverter 51b. The output signal A1 of the inverter 51b is also supplied to the one-bit shift register $51_2$ following the shift register $51_1$. Further, the output signal A1 of the shift register 51b, i.e., the sensor read signal is supplied to the related selection switching element directly or through the inverting circuit.

Each of the one-bit shift registers has a circuit structure shown in FIG. 14B. The inverter 51a and the switch 51d in a block I1 of FIG. 14A are constituted by a clocked CMOS inverter, and the inverter 51c and the switch 51e are also constituted by a clocked CMOS inverter. The shift clock signals $\phi$ and $\bar{\phi}$ having the mutual phase difference of 180° are supplied to the switches 51d and 51e, respectively. The switches 51d of the adjacent one-bit shift registers are respectively controlled by the shift clock signals having the phase difference of 180°. Likewise the switches 51e of the adjacent one-bit shift registers are respectively controlled by the shift clock signals having the phase difference of 180°.

Figure 14C:
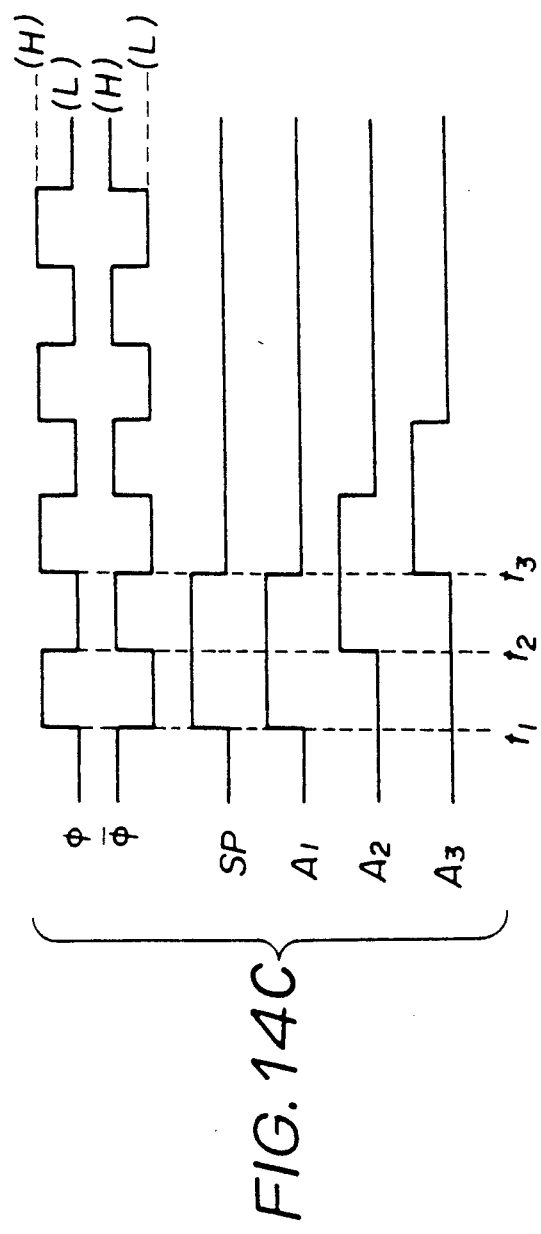
FIG. 14C is an operating time chart of the driving circuit shown in FIG. 14A.

FIG. 14C is a time chart of the driving circuit shown in FIG. 14A. At the time $t_1$, the start pulse SP switches from the low-level to the high-level. In response to this level change, the clocked CMOS inverter I1 of the one-bit shift register $51_1$ shown in FIG. 14B switches from the high-level to the low-level, and thus the following CMOS inverter switches from the low-level to the high-level. During this operation, the shift clock signals $\phi$ and $\bar{\phi}$ are kept in the high and low-levels, respectively. As a result, the sensor read signal A1 of the high-level is produced and transferred to the related selection switching element and the next stage $51_2$. At this time, the output of the clocked CMOS inverter I1 of the shift register $51_1$ is held at the low-level. When the shift clock signals $\phi$ and $\bar{\phi}$ switches from the high and low levels to low and high-levels, respectively, at the time $t_2$, the switches 51d and 51e of the shift register $51_1$ are turned OFF and ON, respectively. At this time, since the output of the inverters 51c is fed back to the input of the inverter 51b through the switch 51e, the output of the inverter 51b is kept at the high-level. Therefore, the sensor read signal A2 of the shift register $51_2$ is changed from the low-level state into the high-level state at the time $t_2$. As a result, the read signal A1 from the shift register $51_1$ is shifted by one bit. In this manner, the sensor read signal A3 switches from the low-level to the high-level at the time $t_3$.

Figure 15:
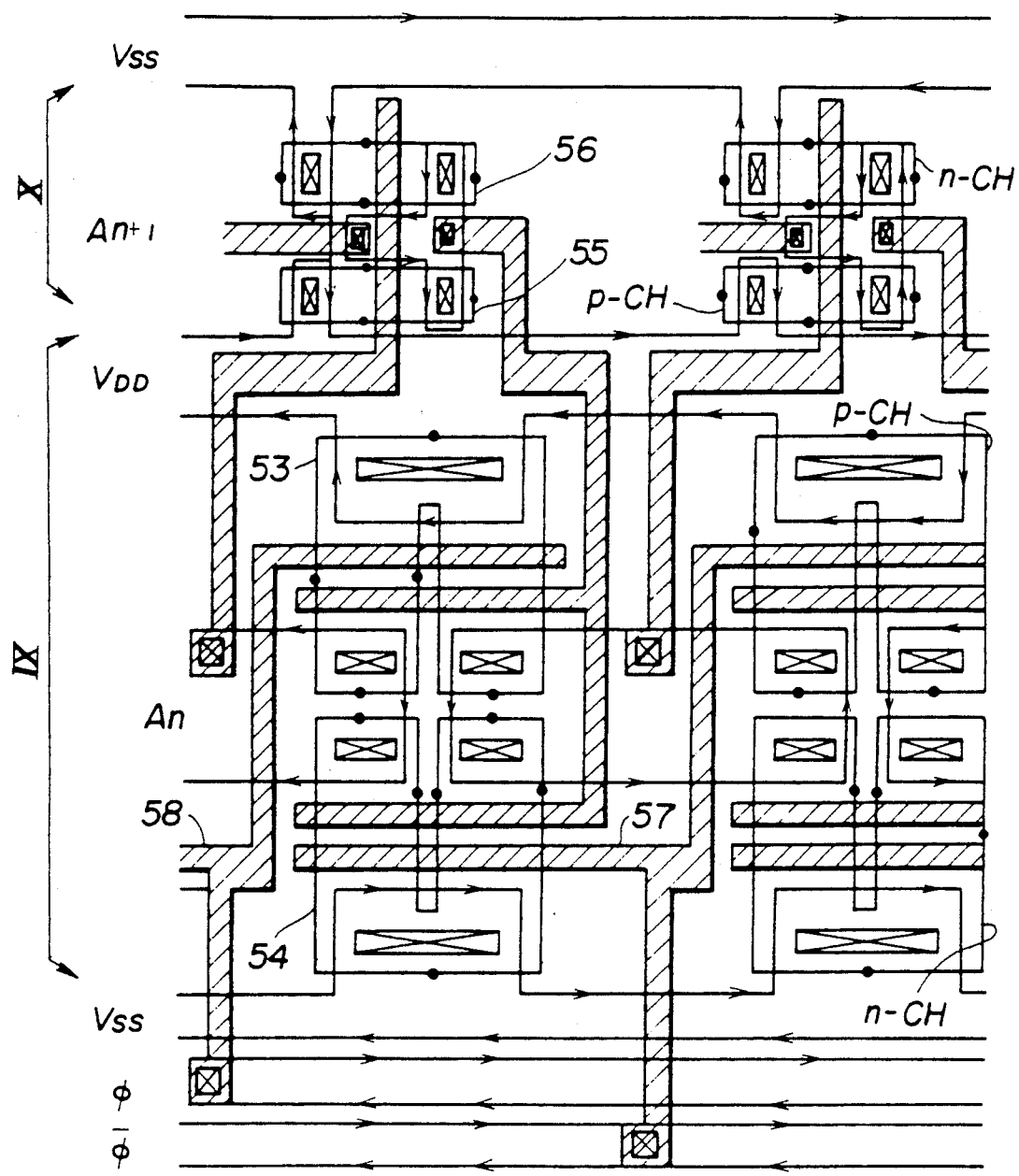
FIG. 15 shows a layout of the circuit of FIG. 14B formed on the insulating and transparent substrate.

FIG. 15 shows a layout corresponding to the circuit shown in FIG. 14B. The illustrated layout is formed by use of the layout shown in FIGS. 12A, 12B and 13, in which the gate electrodes are arranged in the main scanning direction of the image sensor. In a region indicated by IX, the clocked CMOS inverters I1 and I2 of FIG. 14A are formed, and the CMOS inverter interposed therebetween is formed in a region indicated by X. Reference numerals 53 and 54 denote p-channel and n-channel regions, respectively, which are used to form the clocked CMOS inverters I1 and I2. Reference numerals 55 and 56 denote p-channel and n-channel regions, respectively, which are used to form the CMOS inverter.

In the circuit configuration shown in FIG. 14A, the number of the inverters is equal to that for the conventional circuit shown in FIG. 2. However, it should be noted that the clocked CMOS inverter I2 of the shift register $51_1$ and the clocked CMOS inverter I3 of the shift register $51_2$ are driven by the same shift clock signal $\bar{\phi}$. Therefore, it becomes possible to closely locate the clocked CMOS inverters I2 and I3 and also obtain efficient routing of the polysilicon regions on which the shift clock signals $\phi$ and $\bar{\phi}$ are transferred. That is, as shown in FIG. 15, the shift clock signal $\phi$ is supplied to the adjacent one-bit shift registers by a polysilicon region 57. Likewise the shift clock signal $\bar{\phi}$ is supplied to the adjacent one-bit shift registers by a polysilicon region 58.

A description will be given on a second example of the static type shift register used in the present invention, by referring to FIGS. 16A through 16C and 17.

The driving circuit is composed of one-bit shift registers of the static type $60_1, 60_2, 60_3, \ldots$ which are cascade-connected. Each of the one-bit shift registers consists of two inverters 60a and 60b as well as two switches 60c and 60d. The output of the inverter 60b is fed back to the input of the inverter 60a. The switch 60d is interposed between the inverters 60a and 60b. The input signal (the start pulse SP for the first stage $60_1$) is supplied to the inverter 60a through the switch 60c. The sensor read signals A1, A2, A3 are extracted from the respective inverters 60a.

The combination of the switch 60c and the inverter 60a, and the combination of the switch 60d and the inverter 60b are respectively constituted by transmission CMOS inverters, each of which consists of a CMOS transmission gate and a CMOS inverter. In detail, the switches 60c and 60d of each of the one-bit shift registers are constituted by CMOS transmission gates, as shown in FIG. 16B. In the transmission gate making the switch 60c, the shift clock signals $\phi$ and $\bar{\phi}$ are supplied to gates on the p-channel and n-channel sides thereof. In this case, when the clock signals $\phi$ and $\bar{\phi}$ are kept at the high and low-levels, respectively, the transmission gate 60c opens its gate. On the other hand, the shift clock signals $\phi$ and $\bar{\phi}$ are supplied to gates on the n-channel and p-channel sides of the transmission gate 60d, respectively. In this case, when the clock signals $\phi$ and $\bar{\phi}$ are kept at the low and high-levels, respectively, the transmission gate 60d opens its gate. Further, the switches 60c of the adjacent one-bit shift registers $60_1$ and $60_2$ are provided with the shift clock signals $\phi$ and $\bar{\phi}$ of the phase difference of 180°, respectively. Similarly, the switches 60d of the adjacent one-bit shift registers $60_1$ and $60_2$ are provided with the shift clock signals $\bar{\phi}$ and $\phi$, respectively.

Figure 16A:
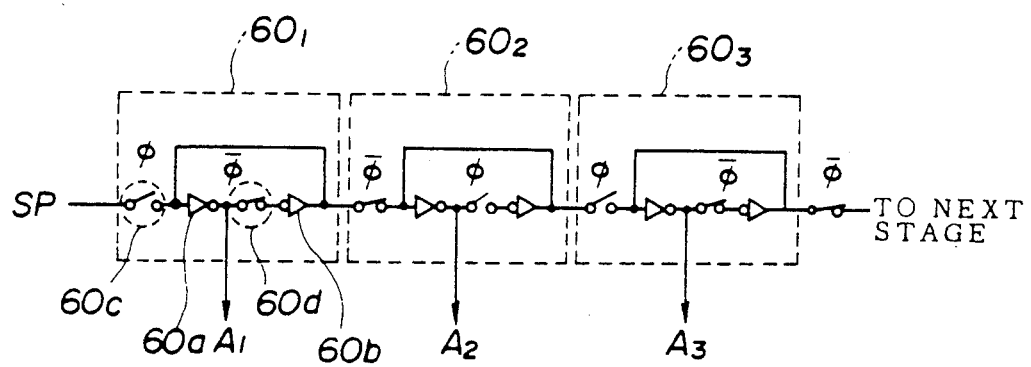
FIG. 16A is a circuit diagram of a second example of a driving circuit constituted by the static type shift register.
Figure 16B:
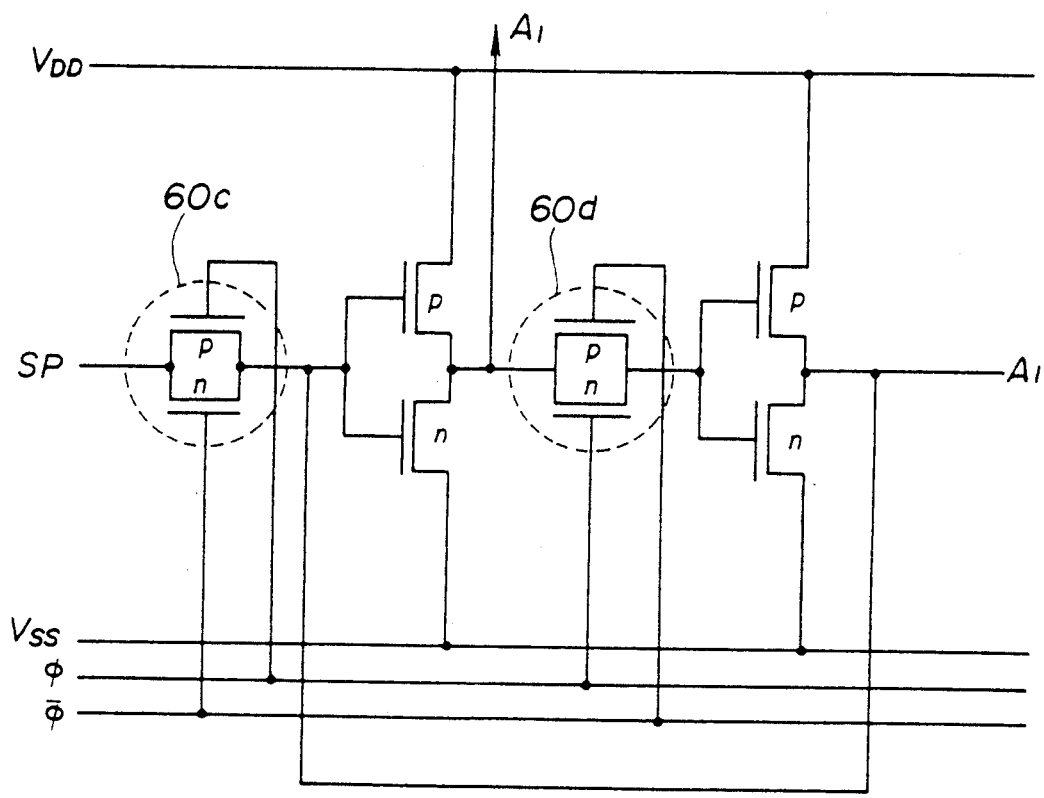
FIG. 16B is a circuit diagram of a one-bit shift register used in the circuit in FIG. 16A.

FIG. 16C is a time chart of the driving circuit shown in FIG. 16A. As seen from this figure, the start pulse SP is shifted for every one bit in synchronization with the shift clock signals $\phi$ and $\bar{\phi}$. The polarities of the sensor read signals A1, A2 and A3 are opposite to those shown in FIG. 8. This is because the input signal is extracted via one stage of the inverter 60c.

Figure 17:
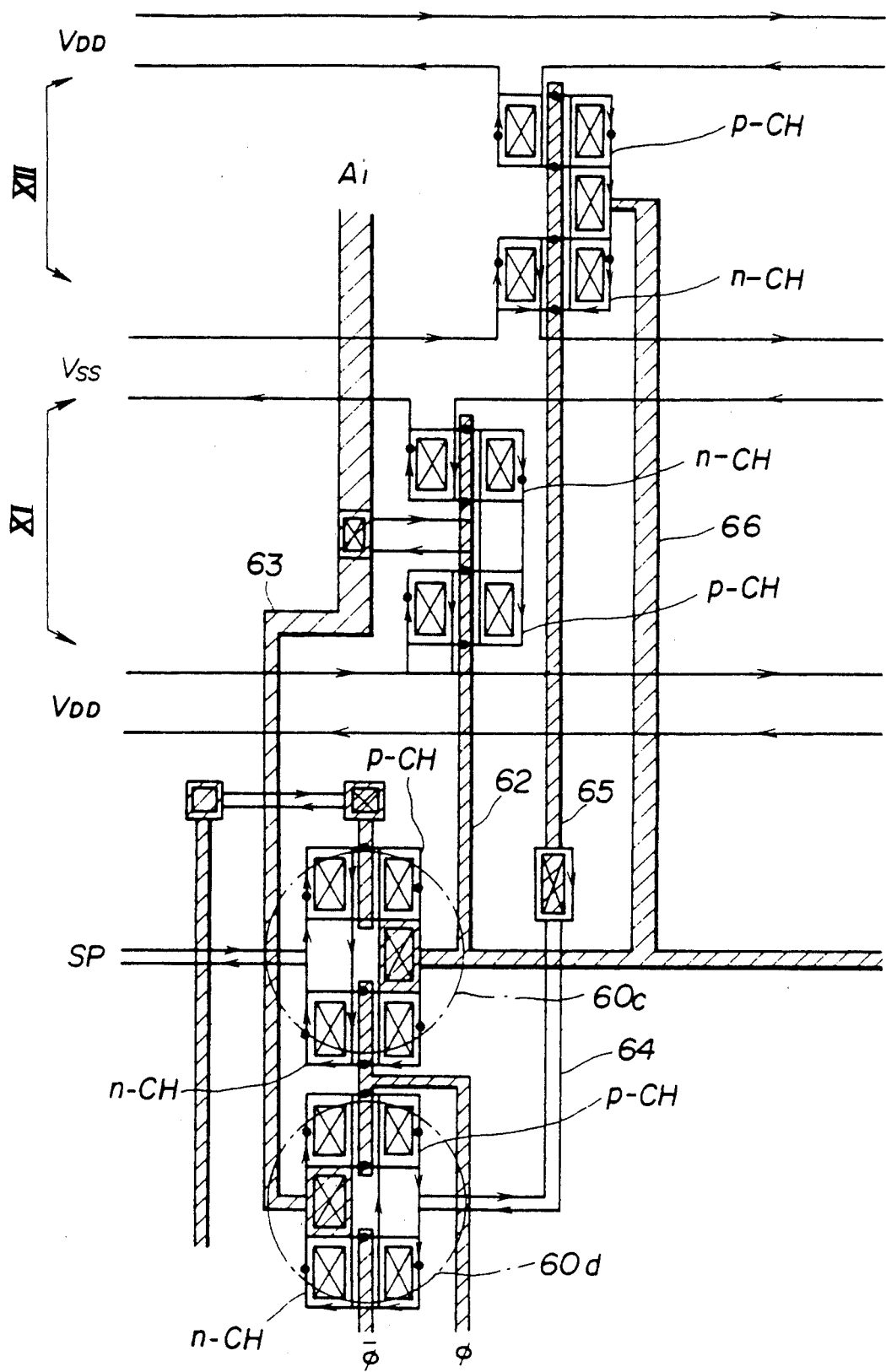
FIG. 17 shows a layout of the circuit shown in FIG. 16B formed on the insulating and transparent substrate.

FIG. 17 shows a layout corresponding to the circuit shown in FIG. 16B. In FIG. 17, regions corresponding to the CMOS transmission gates 60c and 60d are indicated by circles of broken lines. A region XI corresponds to the CMOS inverter 60a, and a region XII corresponds to the CMOS inverter 60b shown in FIG. 16A. The output of the transmission gate 60c is connected to the input of the CMOS inverter 60a in the region XI by a polysilicon region 62. The output signal of the inverter 60a, i.e., the sensor read signal A1 is supplied to the input of the transmission gate 60d through a polysilicon region 63. The output signal of the transmission gate 60d is sent to the common gate of the CMOS inverter 60b through a metallic region 64 and a polysilicon region 65. The output signal of the inverter 60b is fed back to the common gate of the CMOS inverter 60a through polysilicon regions 66 and 62.

Figure 18A:
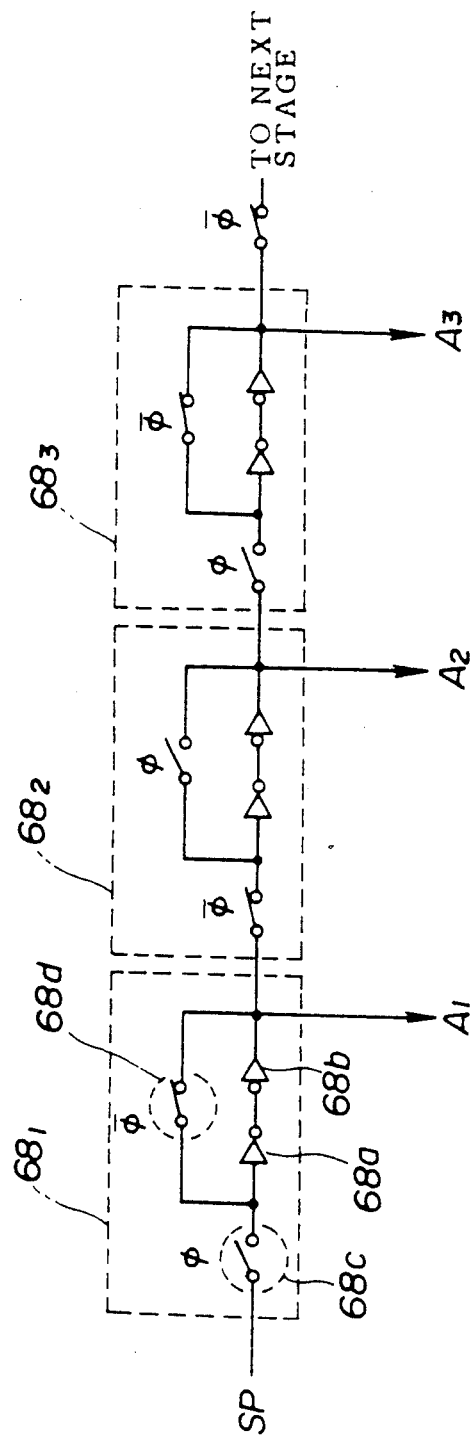
FIG. 18A is a circuit diagram of a third example of a driving circuit constituted by the static type shift register.

A description will be given on a third example of the static type shift register used in the present invention with reference to FIGS. 18A through 18C. A driving circuit is constituted by one-bit shift registers $68_1, 68_2, 68_3, \ldots$ of the static type which are cascade-connected. Each of these one-bit shift registers consists of two CMOS inverters 68a and 68b as well as two switches 68c and 8d. Sensor read signals A1, A2, A3, ... are extracted from the respective inverters 68b. The output of the inverter 68b in each shift register is fed back to the input of the inverter 68a through the which 68d.

Figure 18B:
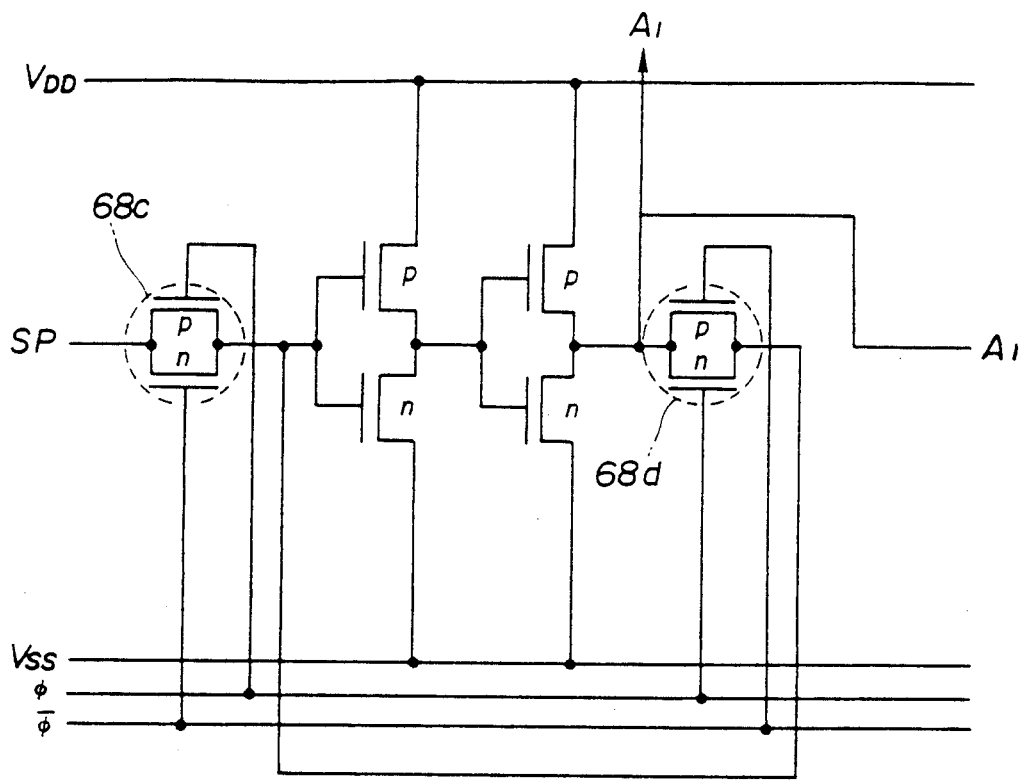
FIG. 18B is a circuit diagram of a one-bit shift register used in the circuit in FIG. 16A.
Figure 18C:
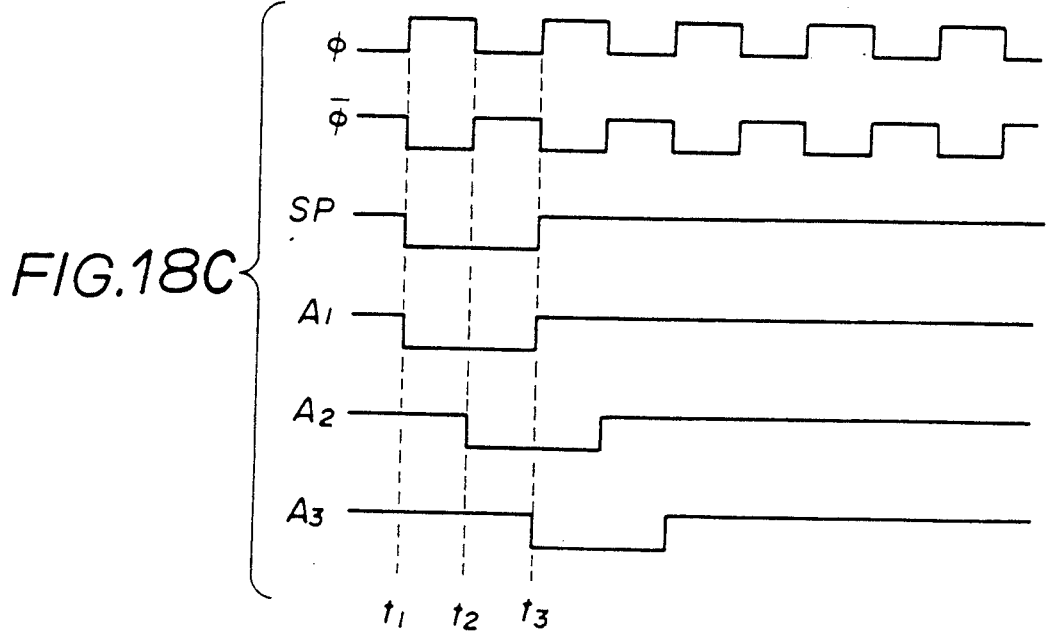
FIG. 18C is an operating time chart of the driving circuit shown in FIG. 18A.

The switches 68c and 68d are made by CMOS transmission gates, as shown in FIG. 18B. The switches 68c and 68d are controlled by the shift clocks of the phase difference of 180°. The switches 68c of the adjacent shift registers such as $68_1$ and $68_2$ are respectively provided with the shift clock signals of the phase difference of 180°. Similarly, the switches 68d of the adjacent shift registers are respectively provided with the shift clock signals of the phase difference of 80°. An operating time chart of the driving circuit shown in FIG. 18A is shown in FIG. 18C.

Figure 19A:
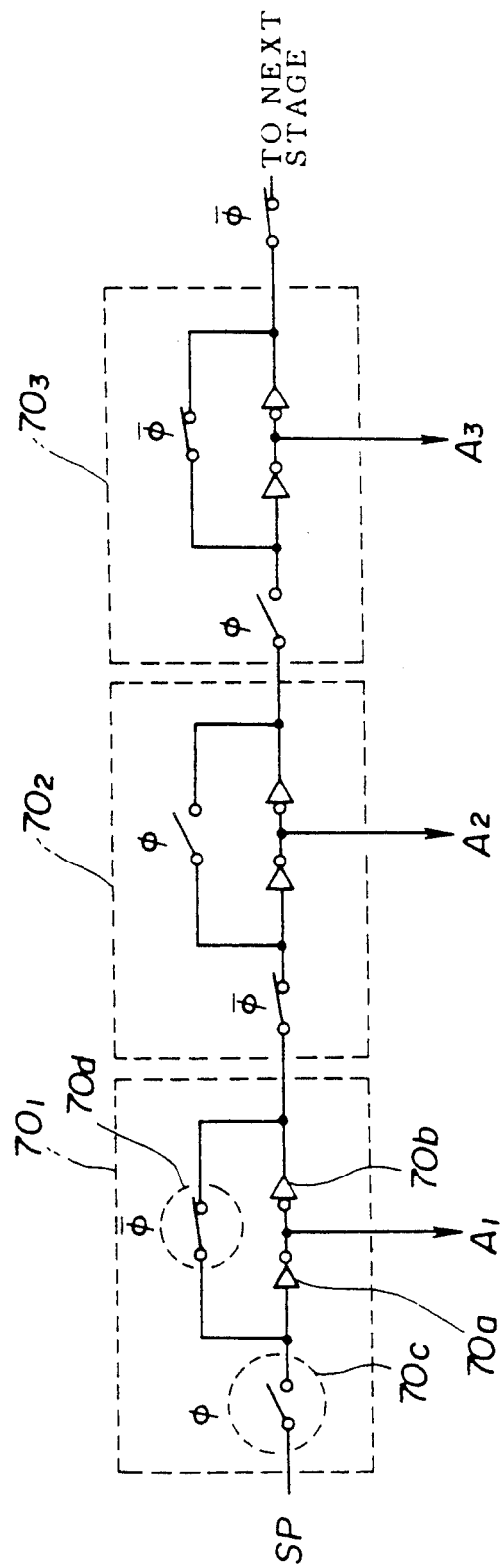
FIG. 19A is a circuit diagram of a fourth example of a driving circuit constituted by the static type shift register.

FIG. 19A is a fourth example of the driving circuit in which the static type one-bit shift registers are used. A driving circuit of this example is composed of one-bit shift registers $70_1, 70_2, 70_3, \ldots$ which are cascade-connected. Each of the one-bit shift registers consists of two CMOS inverters 70a and 70b, as well as two switches 70c and 70d. The input pulse (the start pulse SP for the shift register $70_1$) is applied to the input of the inverter 70a through the switch 70c. The sensor read signal $A_1, A_2, A_3, \ldots$ is extracted from the output of the inverter 70a. The output signal of the inverter 70b is sent to the next stage and is fed back to the input of the inverter 70a through the switch 70d.

Figure 19B:
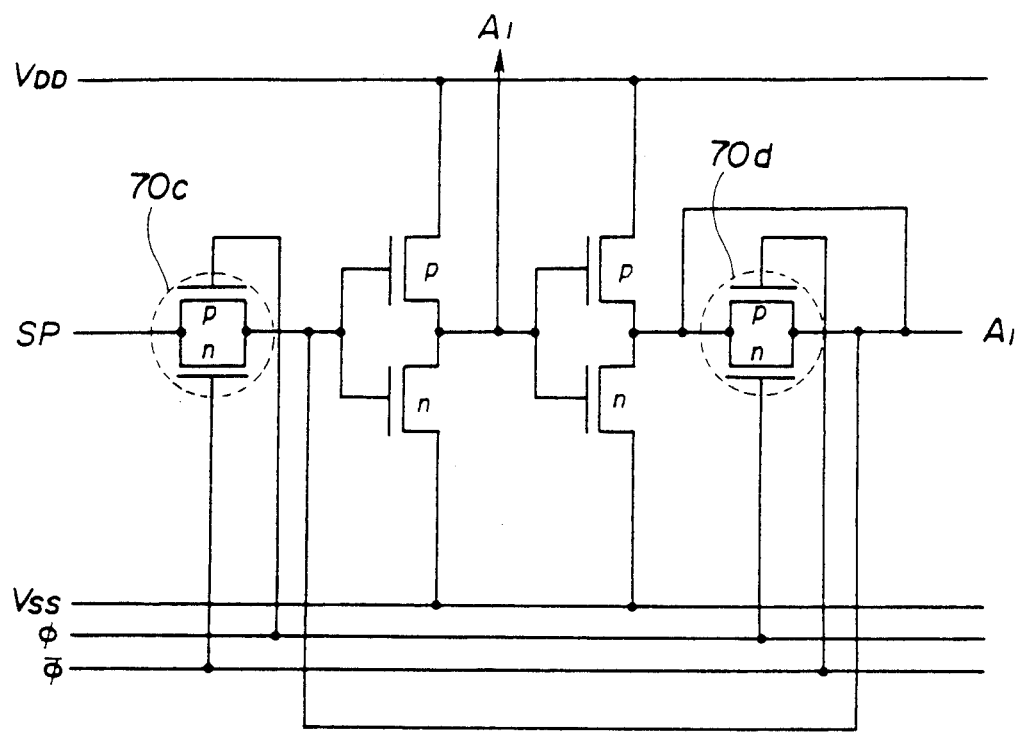
FIG. 19B is a circuit diagram of a one-bit shift register used in the circuit shown in FIG. 19A.
Figure 19C:
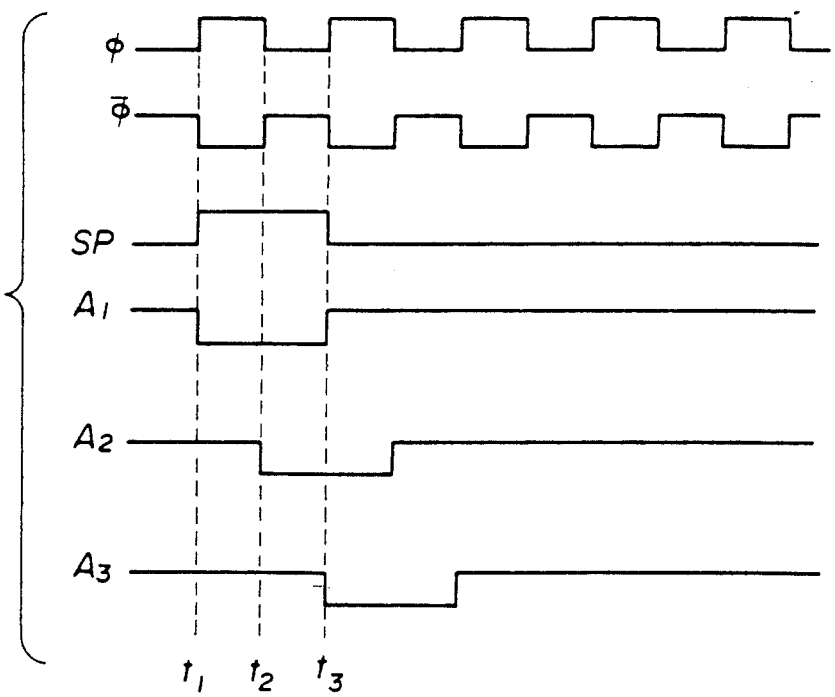
FIG. 19C is an operating time chart of the driving circuit shown in FIG. 19A.

The switches 70c and 70d are constituted by CMOS transmission gates, as shown in FIG. 19B. An operating time chart of the driving circuit of FIG. 19A is illustrated in FIG. 19C.

Figure 20A:
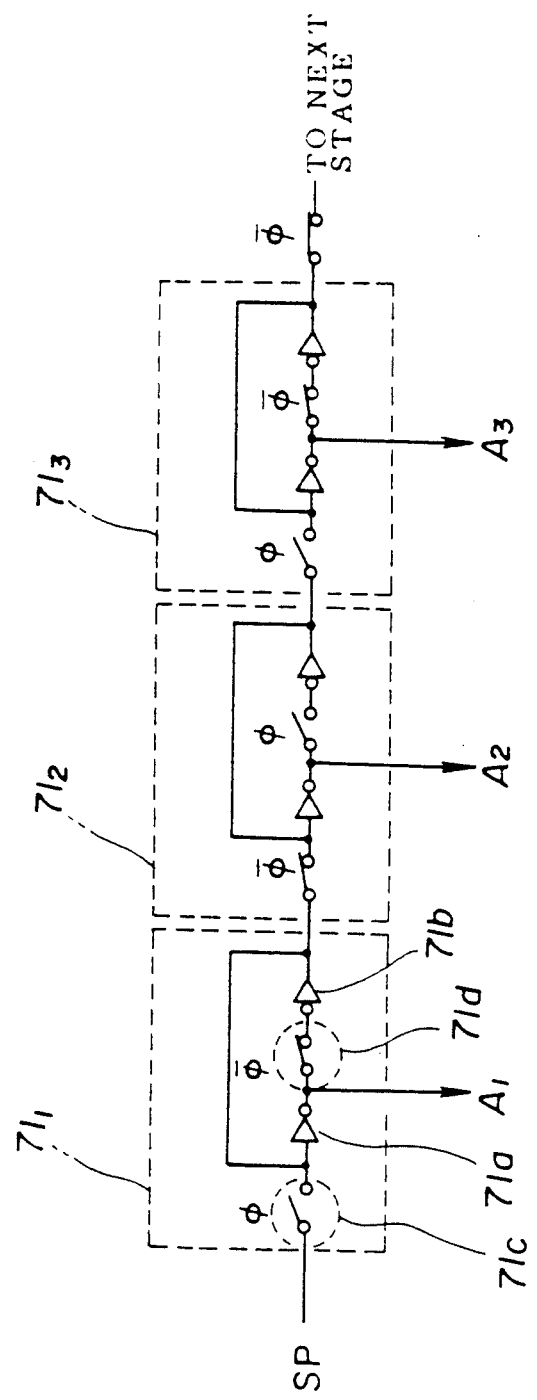
FIG. 20A is a circuit diagram of an example of a driving circuit in which transmission and clocked CMOS inverters are used.

FIG. 20A shows a driving circuit in which each one-bit shift register includes a clocked CMOS inverter and a transmission CMOS inverter. Each of one-bit shift registers $71_1, 71_2, 71_3, \ldots$ includes two inverters 71a and 71b as well as two switches 71c and 71d. As shown in FIG. 20B, the combination of the inverter 71a and the switch 71c is constituted by the transmission CMOS inverter, whereas the combination of the inverter 71b and the switch 71d is constituted by the clocked CMOS inverter (the switch 71d is structured by MOS transistors $71d_1$ and $71d_2$) The start pulse (or the output signal from the preceding stage) is supplied to the inverter 71a through the switch 71c of the CMOS transmission gate. The output of the inverter 71a is used as the sensor read signal, and is sent to the inverter 71b through the switch 71d. The output signal of the inverter 71b is sent to the following stage, and simultaneously fed back to the input of the inverter 71a. An operating time chart of the driving circuit shown in FIG. 20A is illustrated in FIG. 20C.

Figure 21:
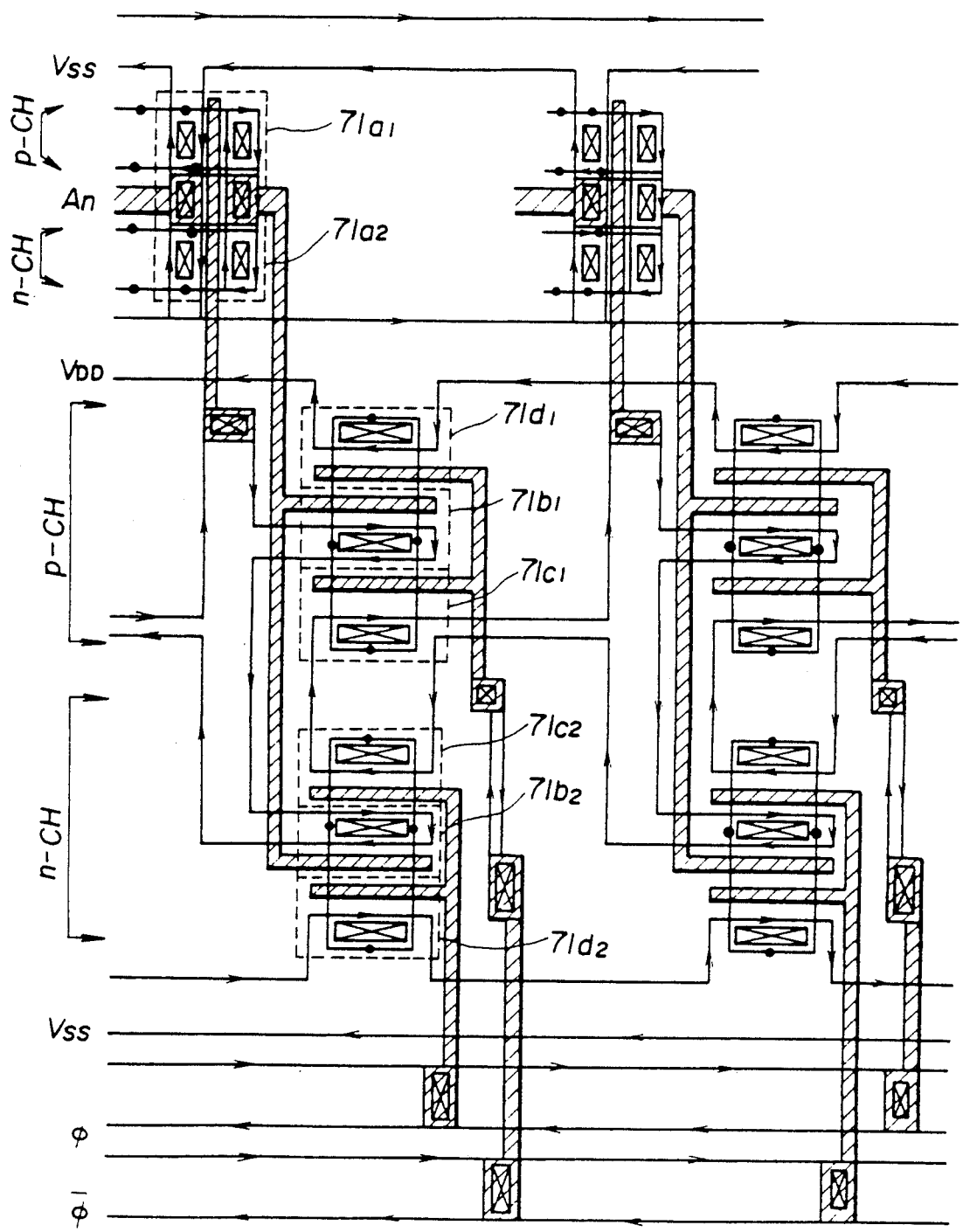
FIG. 21 shows a layout of the circuit of FIG. 20A formed on the insulating and transparent substrate.

FIG. 21 shows a layout including the circuit shown in FIG. 20B. Referring to FIG. 21, in an n-channel region in the vicinity of the power supply line of the potential $V_{SS}$, there are formed n-channel MOS transistors $71b_2$, $71c_2$ and $71d_2$. In a p-channel region next to the n-channel region, p-channel MOS transistors $71b_1, 71c_1$ and $71d_1$ are formed. Further, an n-channel MOS transistor $71a_2$ and a p-channel MOS transistor $71a_1$ are formed in another n-channel and p-channel regions, respectively. The pairs of the transistors $71a_1$ and $71a_2$; $71b_1$ and $71b_2$; $71c_1$ and $71c_2$; and $71d_1$ and $71d_2$ form the inverters 71a, 71b and the switches 71c and 71d, respectively.

Figure 22A:
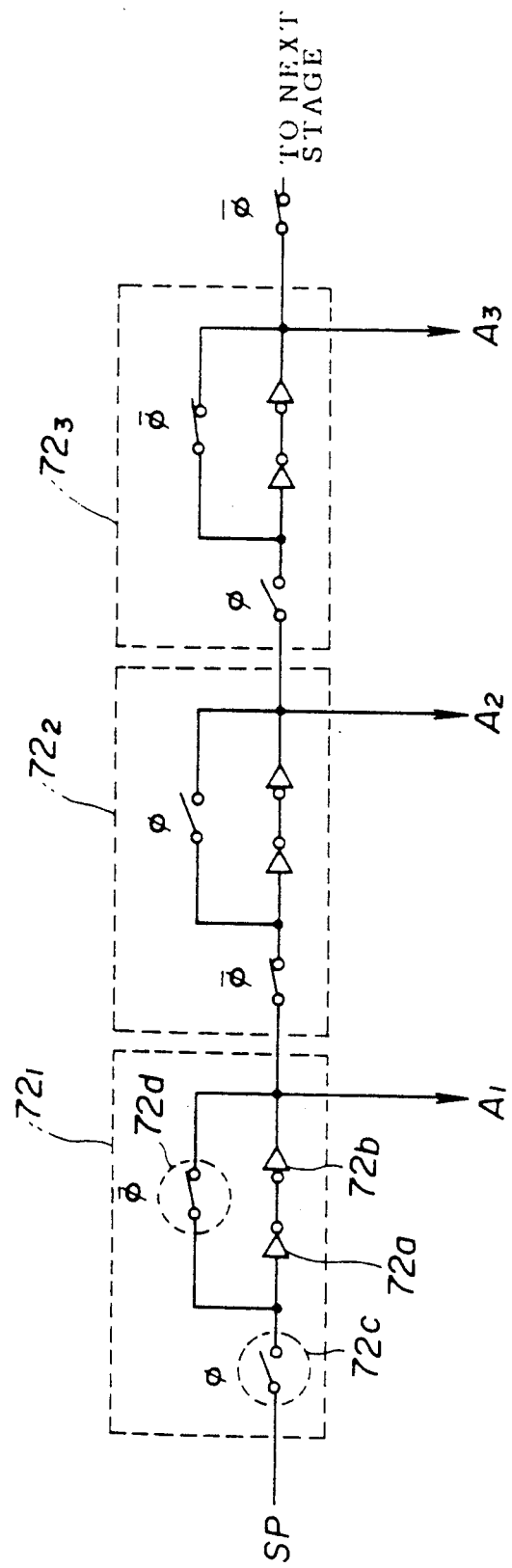
FIG. 22A is a circuit diagram of a second example of a driving circuit in which both the transmission and clocked CMOS inverters are used.

FIGS. 22A through 22C are views for explaining a second example of the driving circuit in which both the clocked and transmission CMOS inverters are used. A driving circuit illustrated in FIG. 22A is composed of one-bit shift registers $72_1, 72_2, 72_3, \ldots$ which are cascade-connected. Each of the one-bit shift registers consists of two inverters 72a and 72b as well as two switches 72c and 72d. The input signal (the start pulse signal SP for the shift register 72₁) are supplied to the inverter 72a through the switch 72c. The output signal of the inverter 72a is fed to the inverter 72b, the output of which is sent to the next stage and is fed back to the input of the inverter 72a.

As shown in FIG. 22B, the combination of the switch 72c and the inverter 72a is constituted by the clocked CMOS inverter, and the combination of the inverter 72b and the switch 72d is constituted by the CMOS transmission gate. The switches 72c and 72d are provided with the shift clock signals of the phase difference of 180°. The switches 72c of the two adjacent one-bit shift registers such as 72₁ and 72₂ are provided with the shift clock signals of the phase difference of 180°. The switches 72d of the two adjacent one-bit shift registers are also provided with the shift clock signals having the phase difference of 180°. FIG. 22C is an operating time chart of the driving circuit shown in FIG. 22A.

Figure 23A:
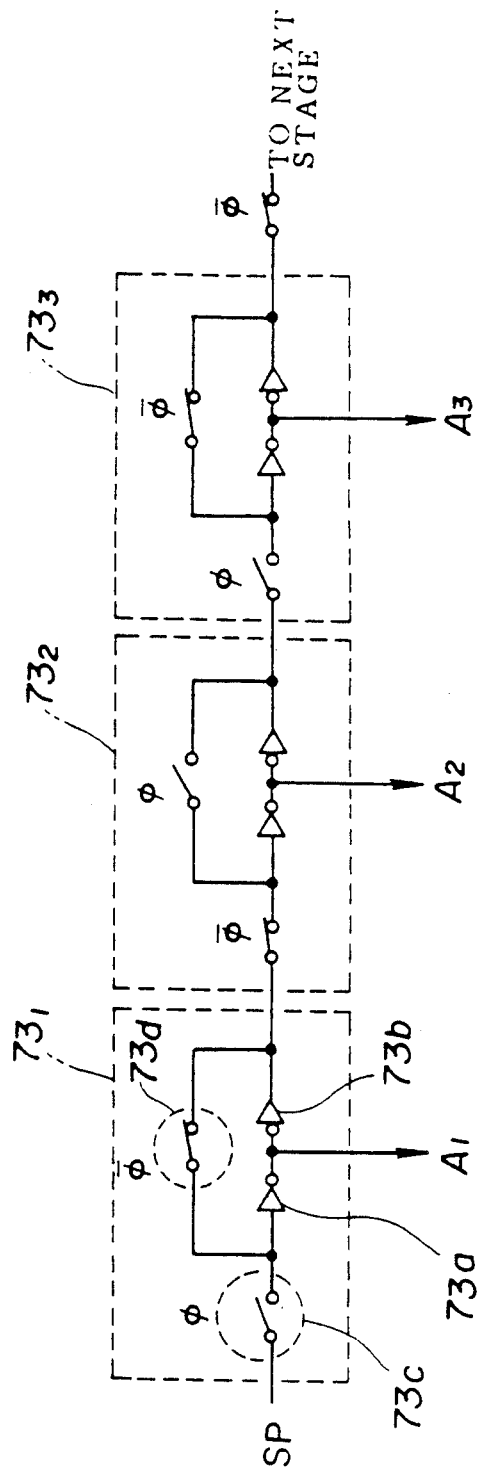
FIG. 23A is a circuit diagram of a third example of a driving circuit in which both the transmission and clocked CMOS inverters are used.
Figure 23B:
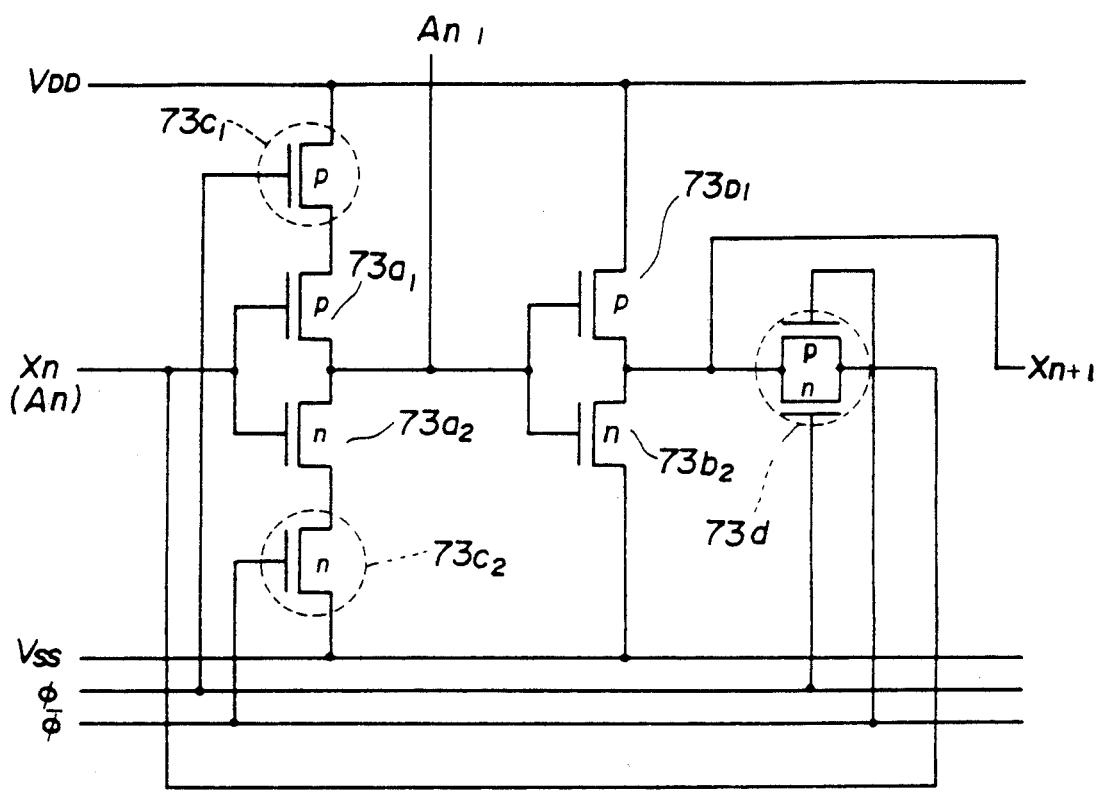
FIG. 23B is a circuit diagram of a one-bit shift registers used in the circuit shown in FIG. 23A.
Figure 23C:
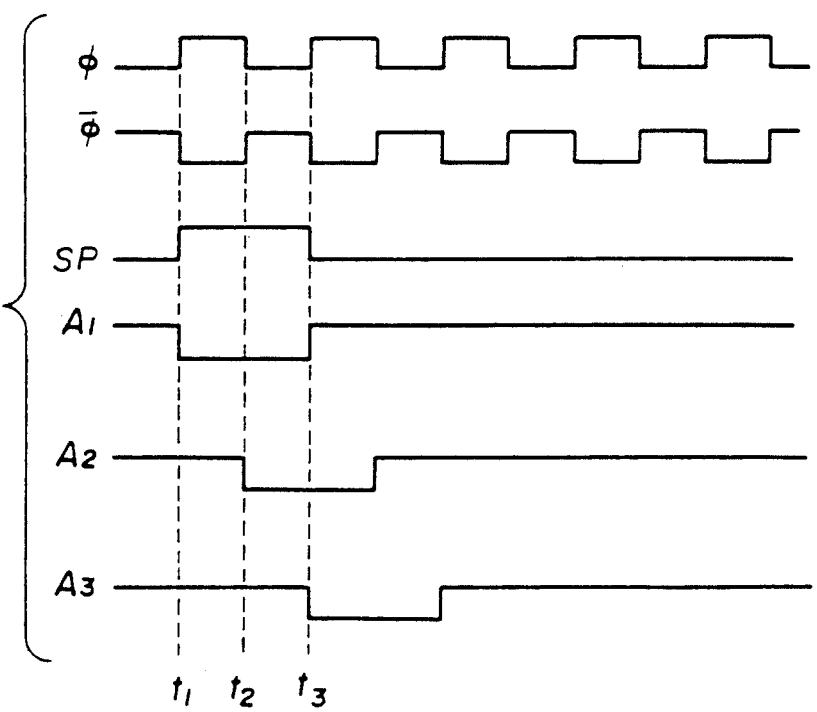
FIG. 23C is an operating time chart of the driving circuit of FIG.23A.

FIGS. 23A through 23C are views for explaining a third example of the driving circuit in which both the clocked and transmission CMOS inverters are used. The driving circuit is made up of one-bit shift registers $73_1, 73_2, 73_3, \ldots$ which are cascade-connected to each other. Each of the one-bit shift registers consists of two inverters 73a and 73b, as well as two switches 73c and 73d. The input signal (the start pulse signal for the shift register 73₁) is supplied to the inverter 73 through the switch 73c. The output signal of the inverter 73a is used as the sensor read signal An, and is supplied to the inverter 73b. The output signal of the inverter 73b is sent to the next stage and is fed back to the input of the inverter 73a.

As shown in FIG. 23B, the combination of the switch 73c and the inverter 73a is made by the clocked CMOS inverter, whereas the combination of the inverter 73b and the switch 73d is constituted by the CMOS transmission gate. FIG. 23C shows an operating time chart of the driving circuit shown in FIG. 23A.

A description will be given on a noise limiter suitable for the image sensor described previously, by referring to FIGS. 24 through 32.

Figure 24:
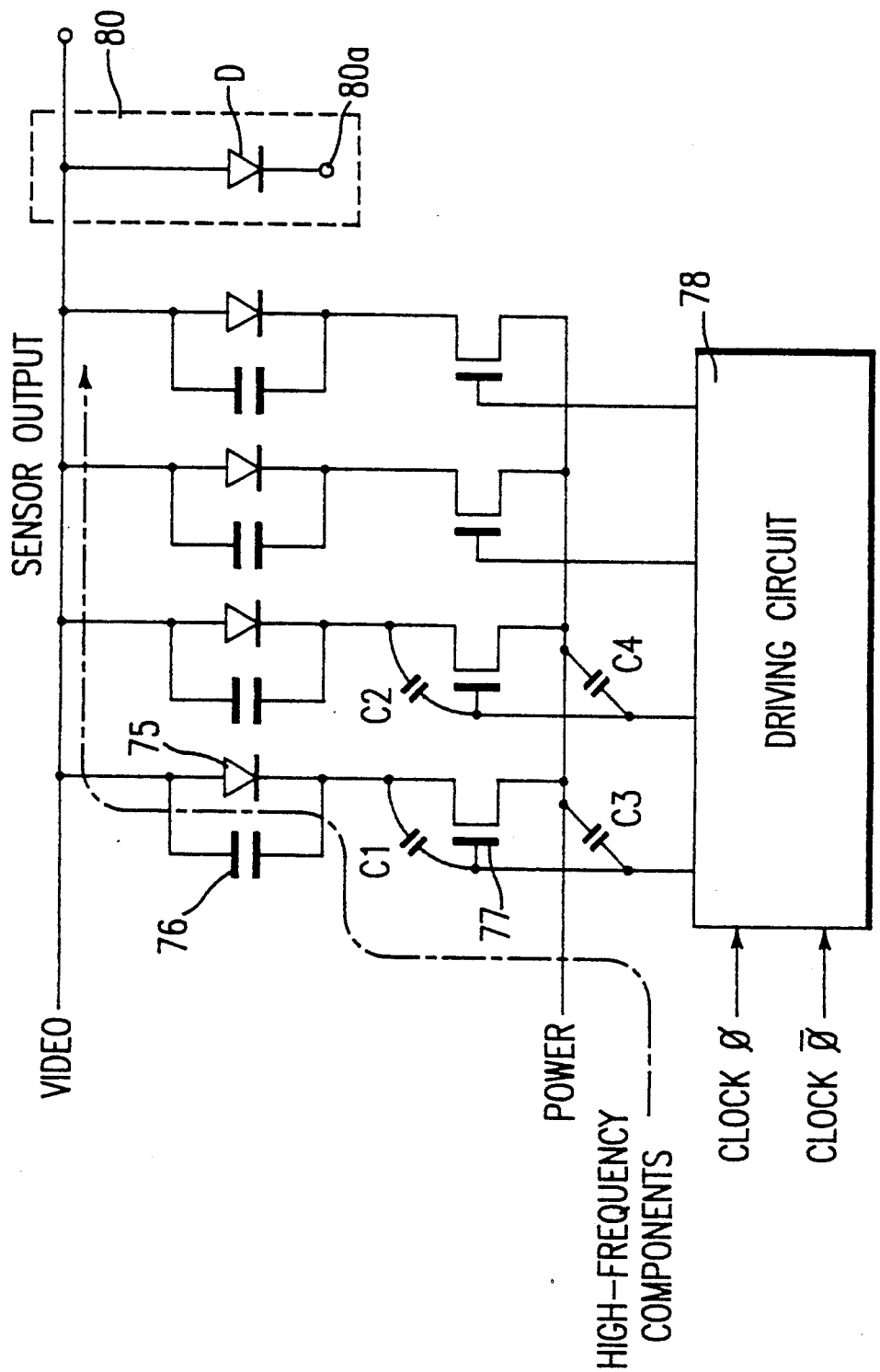
FIG. 24 is a circuit diagram of a line image sensor in which a noise limiter is provided according to the present invention.

FIG. 24 is a circuit diagram of an image sensor with which one example of a noise limiter is provided according to the present invention. Referring to this figure, photoelectric elements (photo diodes) 75, capacitors 76, selection switching elements 77 and a driving circuit 78 are respectively constituted, as described previously. A noise limiter 80 is connected to the video line VIDEO on which the data read from each of the photoelectric elements 75 is transferred. The noise limiter 80 comprises a diode D, the anode of which is connected to the video line. The cathode of the diode D is provided with a reference voltage through a terminal 80a.

FIGS. 25A through 25D are views for explaining the noise limiter 80. As shown in FIG. 25A, the potential of the cathode of the diode D is raised to a voltage El by a battery. A relationship between input and output signals Vi and Vo is shown in FIG. 25B. When the input voltage Vi which is applied to the noise limiter 80 through a resistor R, becomes equal to the voltage E1 or over, the output voltage Vo is fixed to the voltage E1. In this case, a resistance of the resistor R is neglected for simplicity. Therefore, if the input signal (video signal) shown in FIG. 25C is applied to the noise limiter 80, the output signal Vo shown in FIG. 25D can be obtained. As seen from FIG. 25D, a maximum voltage of the output signal is equal to the voltage E1. That is, the video signal delivered from the photoelectric element 75 is amplitude-limited.

As known, one of noises on the video signal is a spike noise which occurs upon the switching operation of the selection switching elements 77 and the like. Therefore, the noise limiter 80 shown in FIG. 24 is designed so as to eliminate the spike noise. The video signal read from the photoelectric elements 75 in synchronization with a clock pulse of FIG. 26A(a) is often distorted as shown in FIG. 26A(b) where noise components N are superimposed on the read video signal. The noise limiter 80 can eliminate the noise components, and can produce the output signal having a waveform as shown in FIG. 26B(b). This results in another advantage of compensating differences in maximum amplitude between the photoelectric elements to thus keep the maximum amplitude constant. As a result, it becomes possible to improve the flatness of a signal waveform corresponding to color of white which is measured in a state where light is projected on all of the photoelectric elements of the line image sensor. As known, this flatness is one of the most important factors for indicating characteristics of the image sensor.

The diode D can be constituted by one MOS transistor in which the source and gate thereof are connected to each other, as shown in FIG. 32. Of course, the diode D is formed on the substrate which is the same as that of the photoelectric elements, selection switching elements and driving circuit.

Figure 27:
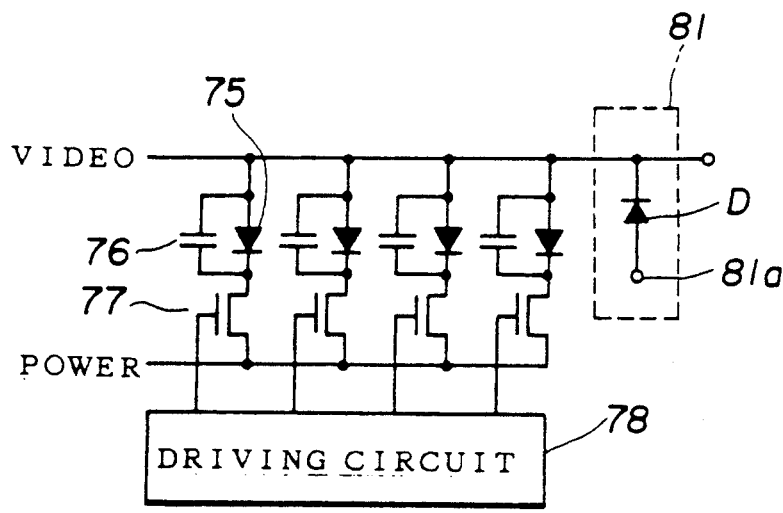
FIG. 27 is a circuit diagram of a line image sensor in which another noise limiter is provided according to the present invention.

FIG. 27 is a circuit diagram of the image sensor having a noise limiter 81. The noise limiter 81 comprises a diode D, the cathode of which is connected to the video line VIDEO. The anode of the diode D is provided with a reference potential through a terminal 81a.

Figure 28A:
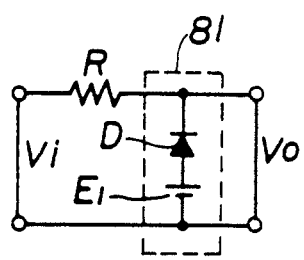
FIGS. 28A through 28D are views for explaining the noise limiter shown in FIG. 27.
Figure 28B:
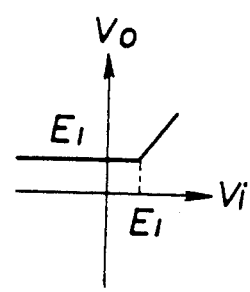
Figure 28C:
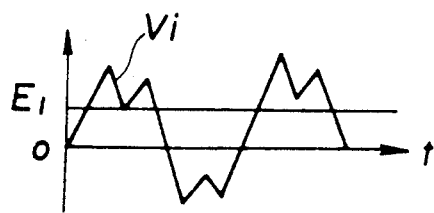
Figure 28D:
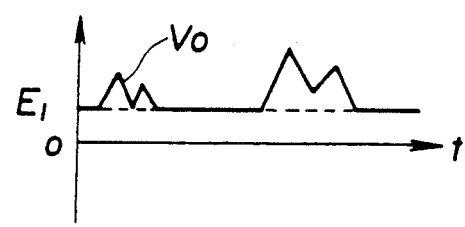

FIGS. 28A through 28D are views for explaining a function of the noise limiter 81. The diode D is biased in the forward direction by the voltage E1 of the battery. In this case, a relationship between input and output voltages Vi and Vo is shown in FIG. 28B. As seen from the figure, the output voltage Vo is clamped at the voltage E1 even when the input voltage Vi less than E1 is applied to the noise limiter 81. Therefore, when the input signal as shown in FIG. 28C is applied to the limiter 81 through the register R, the limiter 81 outputs a signal having a waveform shown in FIG. 28D, in which signal components smaller than the voltage -E1 are eliminated.

The limiter 81 is useful to unify the level of the output signal of the image sensor obtained when no light is projected on all the photoelectric elements (dark signal). The differences in the level of the dark signal degrades a signal-to-noise (S/N) ratio of the image sensor. The limiter 81 can make the level of the dark signal uniform, and thus can improve the S/N ratio. For example, it is assumed that the level of the dark signal which is read in response to the clock in FIG. 29(a) is deviated as shown in FIG. 29(b) with respect to zero volts, for example. The limiter 81 operates so as to unify the level of the dark signal, so that a flat output signal as shown FIG. 29(c) can be obtained.

FIG. 30 is a circuit diagram of a line image sensor having still another noise limiter 83. The noise limiter 83 comprises two diodes D1 and D2. The cathode of the diode D1 is connected to the video line VIDEO, and the anode thereof is provided with a reference potential through a terminal 83a. The cathode of the diode D1 is connected to the video line VIDEO, and the anode thereof is provided with a reference potential through a terminal 83a. The anode of the diode D2 is connected to the video line VIDEO, and the cathode thereof is provided with another reference potential through a terminal 83b.

FIGS. 31A through 31D are views for explaining a function of the noise limiter 83 shown in FIG. 30. Batteries of the voltages E1 and E2 are connected to the diodes D1 and D2, respectively as shown in FIG. 31A. FIG. 31B is a graph showing a characteristic of the limiter 83. When an input signal of a waveform shown in FIG. 31C is applied to the limiter 83, an output shown in FIG. 31D is produced. As seen from the FIG. 31D, signal components exceeding the voltage E1 and signal components smaller than the voltage E2 are eliminated from the input signal Vi. That is, the noise limiter 83 has both the functions of the limiter 80 and 81.

The present invention is not limited to the embodiments described before, but various variations and modifications may be made without departing from the scope of the present invention.

What is claimed is:

1. A photoelectric conversion semiconductor device comprising:

an insulating and transparent substrate;
a plurality of photoelectric conversion elements formed in a line on the insulating and transparent substrate;
selection switching elements comprising a plurality of first thin film transistors formed on the insulating and transparent substrate, for selection photoelectric conversion elements;
a driving circuit comprising a plurality of second thin film transistors formed on the insulating and transparent substrate, for driving the photoelectric conversion elements through the selection switching elements;
the driving circuit including a plurality of one-bit shift registers each having one switch and two series-connected complementary metal oxide semiconductor (CMOS) inverters, and input signal of each one-bit shift register being supplied to one of the CMOS inverters, an output signal of the other of the CMOS inverters being supplied to a next stage of the one-bit shift register, one of the output signals of the two CMOS inverters being supplied to one of the selection switching elements; and
noise limiting means, coupled to the photoelectric conversion elements, for limiting levels of signals read therefrom at a predetermined level to eliminate noise on the read-out signals.

2. A photoelectric conversion semiconductor device as claimed in claim 1, wherein the noise limiting means comprises a diode clamper.

3. A photoelectric conversion semiconductor device as claimed in claim 2, wherein the diode clamper of the noise limiting means is made by a thin film transistor formed on the insulating and transparent substrate, and a gate and source of the thin film transistor of the diode clamper are mutually connected to each other.

4. A photoelectric conversion semiconductor device as claimed in claim 2, wherein said diode clamper comprises a diode which is biased at a predetermined voltage.

5. A photoelectric conversion semiconductor device comprising:

an insulating and transparent substrate;
a plurality of photoelectric conversion elements formed in a line on the insulating and transparent substrate;
selection switching elements comprising a plurality of first thin film transistors formed on the insulating and transparent substrate, for selecting photoelectric conversion elements; and
a driving circuit comprising a plurality of second thin film transistors formed on the insulating and transparent substrate, for driving the photoelectric conversion elements through the selection switching elements;
the driving circuit including a plurality of one-bit shift registers each having first and second switches and first, second and third series-connected complementary metal oxide semiconductor (CMOS) inverters,
wherein an input signal of each one-bit shift register is supplied to the first inverters, an output of the first inverter is supplied to an input of the second inverter through the first switch, and an output of the second inverter is supplied to an input of the third inverter,
an output signal of the third inverter is fed back to the input of the second inverter through the second switch and is supplied to a next stage of the one-bit shift register, the output of the second inverter is supplied to one of the selection switching elements coupled with the photoelectric conversion elements, and wherein the photoelectric conversion semiconductor device further comprises noise limiting means, coupled to the photoelectric conversion elements, for limiting levels of signals read therefrom at a predetermined level to eliminate noise on the read-out signals.

6. A photoelectric conversion semiconductor device as claimed in claim 5, wherein the noise limiting comprises a diode clamper.

7. A photoelectric conversion semiconductor device as claimed in claim 6, wherein the diode clamper of the noise limiting means is made by a thin film transistor formed on the insulating and transparent substrate, and a gate and source of the thin film transistor of the diode clamper are mutually connected to each other.

8. A photoelectric conversion semiconductor device as claimed in claim 6, wherein said diode clamper comprises a diode which is biased at a predetermined voltage.

* * * * *